(12) United States Patent
Kim et al.

(10) Patent No.: US 11,996,046 B2
(45) Date of Patent: May 28, 2024

(54) DISPLAY PANEL AND OPERATION METHOD THEREOF

(71) Applicant: SAMSUNG ELECTRONICS CO., LTD., Suwon-si (KR)

(72) Inventors: Kiwoo Kim, Suwon-si (KR); Seoungyong Park, Suwon-si (KR); Yongkoo Her, Suwon-si (KR); Byungduk Yang, Suwon-si (KR); Taeil Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/097,647

(22) Filed: Jan. 17, 2023

(65) Prior Publication Data

US 2023/0178023 A1    Jun. 8, 2023

Related U.S. Application Data

(63) Continuation of application No. PCT/KR2022/008053, filed on Jun. 8, 2022.

(30) Foreign Application Priority Data

Sep. 8, 2021  (KR) .................... 10-2021-0119621

(51) Int. Cl.
*G09G 3/3233* (2016.01)
*H01L 25/16* (2023.01)

(52) U.S. Cl.
CPC ......... *G09G 3/3233* (2013.01); *H01L 25/167* (2013.01); *G09G 2300/0819* (2013.01);
(Continued)

(58) Field of Classification Search
CPC .......... G09G 3/323; G09G 2300/0819; G09G 2330/021; G09G 2340/0435;
(Continued)

(56) References Cited

U.S. PATENT DOCUMENTS 8,325,113 B2   12/2012   Kim et al.
9,460,662 B2   10/2016   Lee et al.
(Continued)

FOREIGN PATENT DOCUMENTS

JP    2021-509965    4/2021
KR    10-1058111     8/2011
(Continued)

OTHER PUBLICATIONS

International Search Report for PCT/KR2022/008053 dated Sep. 13, 2022, 6 pages.
(Continued)

*Primary Examiner* — Doon Y Chow
*Assistant Examiner* — Dennis Chow
(74) *Attorney, Agent, or Firm* — NIXON & VANDERHYE P.C.

(57) ABSTRACT

A display panel is disclosed. The display panel including a plurality of pixels each including a plurality of sub pixels, the respective sub pixels including a light-emitting device and a driving circuit. Driving circuits included in a display panel may be realized with six N-type metal-oxide-semiconductor thin film transistors (NMOS TFTs) and one Oxide TFT, or realized with five P-type metal-oxide-semiconductor thin film transistors (PMOS TFTs) and two Oxide TFTs making low frequency driving possible, and because the number of TFTs and scan drivers are reduced, manufacturing cost, bezel size and power consumption can be reduced.

15 Claims, 20 Drawing Sheets

(52) U.S. Cl.
CPC ............... *G09G 2300/0842* (2013.01); *G09G 2300/0861* (2013.01); *G09G 2310/08* (2013.01); *G09G 2320/0626* (2013.01); *G09G 2330/021* (2013.01)

(58) Field of Classification Search
CPC ... G09G 2320/0247; G09G 2320/0626; G09G 2310/08; G09G 2310/0251; G09G 2300/0861; G09G 2300/0842; H01L 25/167; H10K 59/12
See application file for complete search history.

(56) References Cited

U.S. PATENT DOCUMENTS

| | | |
|---|---|---|
| 9,741,292 B2 | 8/2017 | Nathan et al. |
| 9,852,691 B2 | 12/2017 | Hyun |
| 10,170,048 B2 | 1/2019 | Lee et al. |
| 10,181,289 B1 | 1/2019 | Chen |
| 10,706,782 B2 | 7/2020 | Lu et al. |
| 10,714,008 B1 | 7/2020 | Lu |
| 10,978,001 B2 | 4/2021 | In et al. |
| 11,217,149 B2 | 1/2022 | In et al. |
| 11,289,028 B2 | 3/2022 | Lee et al. |
| 11,322,087 B1* | 5/2022 | Beard .................. G09G 3/3233 |
| 11,386,838 B2 | 7/2022 | Gao |
| 11,657,759 B2 | 5/2023 | Gao |
| 2011/0069058 A1 | 3/2011 | Chung et al. |
| 2015/0287362 A1 | 10/2015 | Lee et al. |
| 2016/0379569 A1 | 12/2016 | Lee et al. |
| 2018/0158393 A1* | 6/2018 | Woo ...................... G09G 3/3266 |
| 2018/0158410 A1* | 6/2018 | Jeon .................... H01L 27/1222 |
| 2019/0096330 A1* | 3/2019 | Kim ...................... G09G 3/3233 |
| 2020/0394961 A1 | 12/2020 | Kim et al. |
| 2021/0193040 A1 | 6/2021 | Na |
| 2021/0193055 A1 | 6/2021 | Lee et al. |
| 2021/0201764 A1* | 7/2021 | Oh .......................... G09G 3/32 |
| 2021/0225266 A1* | 7/2021 | Hyun ................... G09G 3/3233 |
| 2021/0366386 A1 | 11/2021 | Gao |
| 2022/0335891 A1 | 10/2022 | Gao |

FOREIGN PATENT DOCUMENTS

| | | |
|---|---|---|
| KR | 10-2016-0089555 | 7/2016 |
| KR | 10-2032776 | 10/2019 |
| KR | 10-2020-0037893 | 4/2020 |
| KR | 10-2020-0136859 | 12/2020 |
| KR | 10-2021-0054114 | 5/2021 |
| KR | 10-2021-0080789 | 7/2021 |
| KR | 10-2021-0081538 | 7/2021 |
| KR | 10-2021-0094859 | 7/2021 |
| KR | 20210080789 A * | 7/2021 |

OTHER PUBLICATIONS

Written Opinion of the ISA for PCT/KR2022/008053 dated Sep. 13, 2022, 8 pages.

* cited by examiner (Variable Anode Reset)

DISPLAY PANEL AND OPERATION METHOD THEREOF

CROSS-REFERENCE TO RELATED APPLICATIONS

This application is a continuation of International Application No. PCT/KR2022/008053 designating the United States, filed on Jun. 8, 2022, in the Korean Intellectual Property Receiving Office and claiming priority to Korean Patent Application No. 10-2021-0119621, filed on Sep. 8, 2021, in the Korean Intellectual Property Office, the disclosures of which are incorporated by reference herein in their entireties.

BACKGROUND

1. Field

The disclosure relates to a display panel and an operation method thereof and, for example, to a display panel capable of low frequency driving and an operation method thereof.

2. Description of Related Art

With recent developments in electronic technology, a display driving method of various methods are under development. For example, FIG. 1A shows a P-type metal-oxide-semiconductor low-temperature polycrystalline silicon hybrid oxide and polycrystalline silicon (PMOS LTPS HOP) pixel circuit, and FIG. 1B shows a N-type metal-oxide-semiconductor low-temperature polycrystalline silicon hybrid oxide and polycrystalline silicon (NMOS LTPS HOP) pixel circuit. In FIG. 1A, a Driving TFT (Dr. thin film transistor), T2, T5, T6 and T7 represent an LTPS TFT, and T3 and T4 represent an Oxide TFT.

In describing an operation of the PMOS LTPS HOP pixel circuit for convenience of description, the PMOS LTPS HOP pixel circuit may typically operate as an address scan, but may operate as a self scan when being driven at a low frequency. As illustrated in FIG. 1C, the PMOS LTPS HOP pixel circuit may be configured such that a signal of some scan drivers is not changed when operating in the self scan, and as illustrated in FIG. 1D, power consumption may be reduced because data is input at the low frequency.

Further, with the PMOS LTPS HOP pixel circuit, a brightness difference between an address scan period and a self scan period and a flickering of a screen may occur at low frequency driving. Specifically, in a brightness graph at a lower end of FIG. 1D, a solid line represents brightness when operating in the address scan, a dotted line represents brightness when operating in the self scan, and a brightness difference of up to a difference between the solid line and the dotted line may occur. Accordingly, the PMOS LTPS HOP pixel circuit may be configured to compensate brightness using a Vbias (Vp) voltage and a variable anode reset (VAR) voltage when low frequency driving.

The PMOS LTPS HOP pixel circuit may require a separate scan driver for driving T3 and T4, which are oxide TFTs, and a driving power consumption and a bezel size may increase accordingly. Even with the NMOS LTPS HOP pixel circuit, a separate EM driver may be added for low frequency driving, and the driving power consumption and the bezel size may increase accordingly.

In addition, when using the Driving TFT as a PMOS TFT, an instantaneous image sticking such as screen blurring may occur because of poor hysteresis characteristics.

Further, in the case of the NMOS LTPS HOP pixel circuit, because a light-emitting device is connected to a Driving TFT source node, it may be vulnerable to a mura based on a device distribution of the light-emitting device.

Accordingly, a pixel circuit may be necessary to address the problems as described above.

SUMMARY

Embodiments of the disclosure provide a display panel capable of low frequency driving with improved power consumption, bezel size and image quality and an operation method thereof.

According to an example embodiment, a display panel comprises: a plurality of pixels each including a plurality of sub pixels, the respective sub pixels including a light-emitting device comprising a light emitting diode; a first transistor, a second transistor configured such that any one from among a drain terminal and a source terminal of the second transistor is connected to a source terminal of the first transistor, a third transistor configured such that any one from among a drain terminal and a source terminal of the third transistor is connected to a gate terminal of the first transistor and other of the drain terminal and source terminal of the third transistor is connected to a drain terminal of the first transistor, a fourth transistor configured such that any one from among a drain terminal and a source terminal of the fourth transistor is connected to the drain terminal of the first transistor, a fifth transistor configured such that any one from among a drain terminal and a source terminal of the fifth transistor is connected to a cathode of the light-emitting device and the other of the drain terminal and source terminal of the fifth transistor is connected to the drain terminal of the first transistor, a sixth transistor configured such that any one from among a drain terminal and a source terminal of the sixth transistor is connected to the source terminal of the first transistor, a seventh transistor configured such that any one from among a drain terminal and a source terminal of the seventh transistor is connected to the cathode of the light-emitting device, and a capacitor configured such that one end is connected to the gate terminal of the first transistor.

A gate terminal of the second transistor and a gate terminal of the seventh transistor is configured to receive a first scan signal, a gate terminal of the third transistor is configured to receive a second scan signal, a gate terminal of the fourth transistor is configured to receive a third scan signal, the other from among the drain terminal and the source terminal of the second transistor is configured to receive a data signal, the other from among the drain terminal and the source terminal of the fourth transistor is configured to receive a first initialization signal, the other from among the drain terminal and the source terminal of the seventh transistor is configured to receive a second initialization signal, a gate terminal of the fifth transistor and a gate terminal of the sixth transistor is configured to receive a light-emitting signal, an anode of the light-emitting device is connected to a first power source, and the other from among the drain terminal and the source terminal of the sixth transistor and other end of the capacitor is connected to a second power source.

The first scan signal, the second scan signal, the third scan signal, and the light-emitting signal are respectively low voltages during a first time period, the fourth transistor is turned-on based on the third scan signal being changed to a high voltage during a second time period directly after the first time period, and the first initialization signal is a pre-set first initialization value, and is applied to a drain terminal of the first transistor according to the fourth transistor being turned-on.

The third transistor is configured to be turned-on based on the second scan signal being changed to a high voltage during a third time period directly after the second time period, and the first initialization signal is configured to be applied to the gate terminal of the first transistor based on the third transistor being turned-on.

The second transistor and the seventh transistor are configured to be turned-on based on the first scan signal being changed to a high voltage during a fourth time period directly after the third time period, the fourth transistor is configured to be turned-off based on the third scan signal being changed to a low voltage during the fourth time period, the data signal is a first data value, and the data signal is configured to be applied to the gate terminal, the drain terminal and the source terminal of the first transistor based on the second transistor being turned-on, and the second initialization signal is a pre-set second initialization value, and the second initialization signal is configured to be applied to the cathode of the light-emitting device based on the seventh transistor being turned-on.

The second transistor and the seventh transistor are configured to be turned-off based on the first scan signal being changed to a low voltage during a fifth time period directly after the fourth time period, the third transistor is configured to be turned-off based on the second scan signal being changed to a low voltage during the fifth time period, and the data signal is maintained in the gate terminal, the drain terminal and the source terminal of the first transistor through the capacitor.

The fifth transistor and the sixth transistor are configured to be turned-on based on the light-emitting signal being changed to a high voltage during a sixth time period directly after the fifth time period, and the light-emitting device is configured to emit light based on the fifth transistor and the sixth transistor being turned-on.

The fifth transistor and the sixth transistor are configured to be turned-off based on the light-emitting signal being changed to a low voltage during a seventh time period directly after the sixth time period, and the light-emitting device is configured to stop emission based on the fifth transistor and the sixth transistor being turned-off.

The second transistor and the seventh transistor are configured to be turned-on based on the first scan signal being changed to a high voltage based on the display panel being changed from a first mode to a second mode during an eighth time period directly after the seventh time period, the data signal is a second data value obtained based on the first data value, and is applied to the drain terminal and the source terminal of the first transistor based on the second transistor being turned-on, and the second initialization signal is a pre-set third initialization value, and is applied to the cathode of the light-emitting device based on the seventh transistor being turned-on.

The second transistor and the seventh transistor are configured to be turned-off based on the first scan signal being changed to a low voltage during a ninth time period directly after the eighth time period.

The fifth transistor and the sixth transistor are configured to be turned-on based on the light-emitting signal being changed to a high voltage during a tenth time period directly after the ninth time period, and the light-emitting device is configured to emit light based on the fifth transistor and the sixth transistor being turned-on.

The fifth transistor and the sixth transistor are configured to be turned-off based on the light-emitting signal being changed to a low voltage during an eleventh time period directly after the tenth time period, and the light-emitting device is configured to stop emission based on the fifth transistor and the sixth transistor being turned-off.

The display panel is configured to be changed from the first mode to the second mode based on a used state of the display panel.

The first transistor, the second transistor, the fourth transistor, the fifth transistor, the sixth transistor, and the seventh transistor are respectively a N-type metal-oxide-semiconductor (NMOS) low temperature polycrystalline silicon (LTPS) thin film transistor (TFT), and the third transistor is a NMOS Oxide TFT.

According to an example embodiment, a display panel comprises: a plurality of pixels each including a plurality of sub pixels, the respective sub pixels including a light-emitting device comprising a light emitting diode and a driving circuit, \the driving circuit including: a first transistor, a second transistor configured such that any one from among a drain terminal and a source terminal of the second transistor is connected to a source terminal of the first transistor, a third transistor configured such that any one from among a drain terminal and a source terminal of the third transistor is connected to a gate terminal of the first transistor and other of the drain terminal and source terminal of the third transistor is connected to a drain terminal of the first transistor, a fourth transistor configured such that any one from among a drain terminal and a source terminal of the fourth transistor is connected to the drain terminal of the first transistor, a fifth transistor configured such that any one from among a drain terminal and a source terminal of the fifth transistor is connected to a source terminal of the first transistor, a sixth transistor configured such that any one from among a drain terminal and a source terminal of the sixth transistor is connected to an anode of the light-emitting device and the other of the drain terminal and source terminal of the sixth transistor is connected to the drain terminal of the first transistor, a seventh transistor configured such that any one from among a drain terminal and a source terminal of the seventh terminal is connected to the anode of the light-emitting device, and a capacitor configured such that one end is connected to the gate terminal of the first transistor.

According to an example embodiment, a method of operating a display panel includes: applying a first initialization signal to a gate terminal, a drain terminal and a source terminal of a driving transistor, applying a data signal to the gate terminal, the drain terminal and the source terminal of the driving transistor and applying a second initialization signal to one end of the driving transistor and a light-emitting device, maintaining the data signal applied to the gate terminal of the driving transistor through a capacitor, and emitting the light-emitting device by turning-on a first light-emitting transistor disposed between the drain terminal of the driving transistor and the light-emitting device and a second light-emitting transistor connected to the source terminal of the driving transistor.

According to various example embodiments, respective driving circuits included in a display panel may be realized with six N-type metal-oxide-semiconductor thin film transistors (NMOS TFTs) and one Oxide TFT, or realized with five P-type metal-oxide-semiconductor thin film transistors (PMOS TFTs) and two Oxide TFTs making low frequency driving possible, and because the number of TFTs and scan drivers are reduced, manufacturing cost, bezel size and power consumption can be reduced.

In addition, because a light-emitting device is connected to a drain node of a Driving TFT, mura issues according to device distribution of the light-emitting device may be reduced.

Further, because the Driving TFT is used as the NMOS TFT, hysteresis characteristic is improved, and an occurrence of instantaneous image sticking such as screen blurring as a result therefrom may be reduced.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1A:
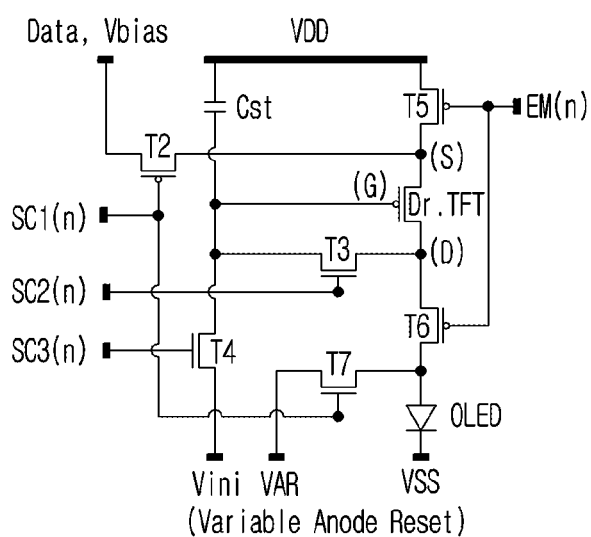
FIGS. 1A, 1B, 1C and 1D are diagrams illustrating a driving method of a display panel to assist in the understanding of the disclosure.

The various example embodiments of the present disclosure may be diversely modified. Accordingly, specific example embodiments are illustrated in the drawings and are described in greater detail in the detailed description. However, it is to be understood that the present disclosure is not limited to a specific example embodiment, but includes all modifications, equivalents, and substitutions without departing from the scope and spirit of the present disclosure. Well-known functions or constructions may not be described in detail where they would obscure the disclosure with unnecessary detail.

The disclosure will be described in greater detail below with reference to the accompanying drawings.

The terms used in describing the various embodiments of the disclosure are general terms selected that are currently widely used considering their function herein. However, the terms may change depending on intention, legal or technical interpretation, emergence of new technologies, and the like of those skilled in the related art. Further, in certain cases, there may be terms that are arbitrarily selected, and in this case, the meaning of the term will be disclosed in greater detail in the corresponding description. Accordingly, the terms used herein are not to be understood simply as its designation but based on the meaning of the term and the overall context of the disclosure.

In the disclosure, expressions such as "comprise," "may comprise," "include," "may include," or the like are used to designate a presence of a corresponding characteristic (e.g., elements such as numerical value, function, operation, or component, etc.), and not to preclude a presence or a possibility of additional characteristics.

The expression at least one of A and/or B is to be understood as indicating at least one of "A" or "B" or "A and B."

Expressions such as "first", "second", "1st," "2nd," and so on used herein may be used to refer to various elements regardless of order and/or importance, and it should be noted that the expressions are merely used to distinguish an element from another element and not to limit the relevant elements.

A singular expression includes a plural expression, unless otherwise specified. It is to be understood that the terms such as "comprise" or "include" are used herein to designate a presence of a characteristic, number, step, operation, element, component, or a combination thereof, and not to preclude a presence or a possibility of adding one or more of other characteristics, numbers, steps, operations, elements, components or a combination thereof.

In this disclosure, the term "user" may refer to a person using an electronic device or a device (e.g., artificial intelligence electronic device) using an electronic device.

The various example embodiments of the disclosure will be described in greater detail below with reference to the accompanied drawings.

Figure 2:
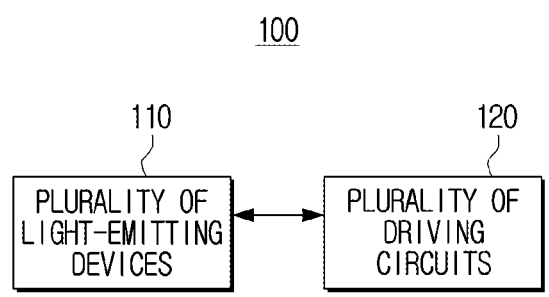
FIG. 2 is a block diagram illustrating an example configuration of a display panel according to various embodiments.

FIG. 2 is a block diagram illustrating an example configuration of a display panel 100 according to various embodiments. Referring to FIG. 2, the display panel 100 may include light-emitting devices 110 and a plurality of driving circuits 120. A structure of the display panel 100 will be described below.

The display panel 100 may include a plurality of pixels arranged in a matrix form. The respective pixels may include a plurality of sub pixels. For example, the display panel 100 may include the plurality of pixels (3840×2160 pixels) arranged in the matrix form, and the respective pixels may include three types of sub pixels such as a red (R) sub pixel, a green (G) sub pixel, and a blue (B) sub pixel.

However, the disclosure is not limited thereto, and may be realized as a display panel 100 of various different resolutions or a display panel 100 of different structure. For example, the respective pixels may be realized as four types of sub pixels such as R, G, B and white (W), and sub pixels of different numbers may comprise one pixel according to an embodiment.

The sub pixel may include the light-emitting device. The light-emitting device may be disposed on the driving circuit to be electrically connected with the driving circuit, and may be configured to emit light based on a driving current provided from the driving circuit.

The light-emitting device may include a plurality of types according to a color of light emitted. For example, the light-emitting device may include a red (R) light-emitting device configured to emit light of a red color, a green (G) light-emitting device configured to emit light of a green color, and a blue (B) light-emitting device configured to emit light of a blue color.

According to an embodiment, the type of the sub pixel may be determined according to the type of the light-emitting device. For example, the R light-emitting device may comprise a R sub pixel, the G light-emitting device may comprise a G sub pixel, and the B light-emitting device may comprise a B sub pixel.

The light-emitting device may be realized as an inorganic light-emitting device manufactured using an inorganic material, different from an organic light-emitting diode (OLED) which is manufactured using an organic material. Below, the light-emitting device may refer, for example, to an inorganic light-emitting device which is different from an OLED.

According to an embodiment of the disclosure, the light-emitting device may be a micro light-emitting diode (u-LED). The micro LED may refer, for example, to an ultra-small inorganic light-emitting device of less than or equal to about 100 micrometers (μm) that emits light on its own without a backlight or a color filter.

The plurality of driving circuits 120 may be configured to drive the plurality of sub pixels, respectively. For example, based on there being 3840×2160 pixels, there may be 3840×2160×3 driving circuits 120.

The respective driving circuits 120 may be disposed in the display panel 100 to electrically connect with the corresponding sub pixels, and output the driving current to emit light of the corresponding sub pixel. For example, the light-emitting device of the sub pixel may be configured to emit light at a high brightness the greater an amplitude of the driving current is, and emit light at a high brightness the longer a pulse width is (the higher a duty ratio is or the longer a driving time is).

The respective driving circuits 120 may be configured to drive the corresponding light-emitting devise to express a grayscale in sub pixel units. As described above, because the display panel 100 is configured such that the sub pixels are comprised in the light-emitting device units, and unlike a liquid crystal display (LCD) panel which uses a plurality of LEDs emitting light in a same single color as the backlight, the respective driving circuits 120 may be configured drive the corresponding light-emitting devices to differently express the grayscale in sub pixel units.

As described above, the display panel 100 may include the plurality of light-emitting devices 110 and the plurality of driving circuits 120, and prior to describing a circuit configuration of the respective driving circuits 120, a schematic operation of the display panel 100 may be described.

Figure 3:
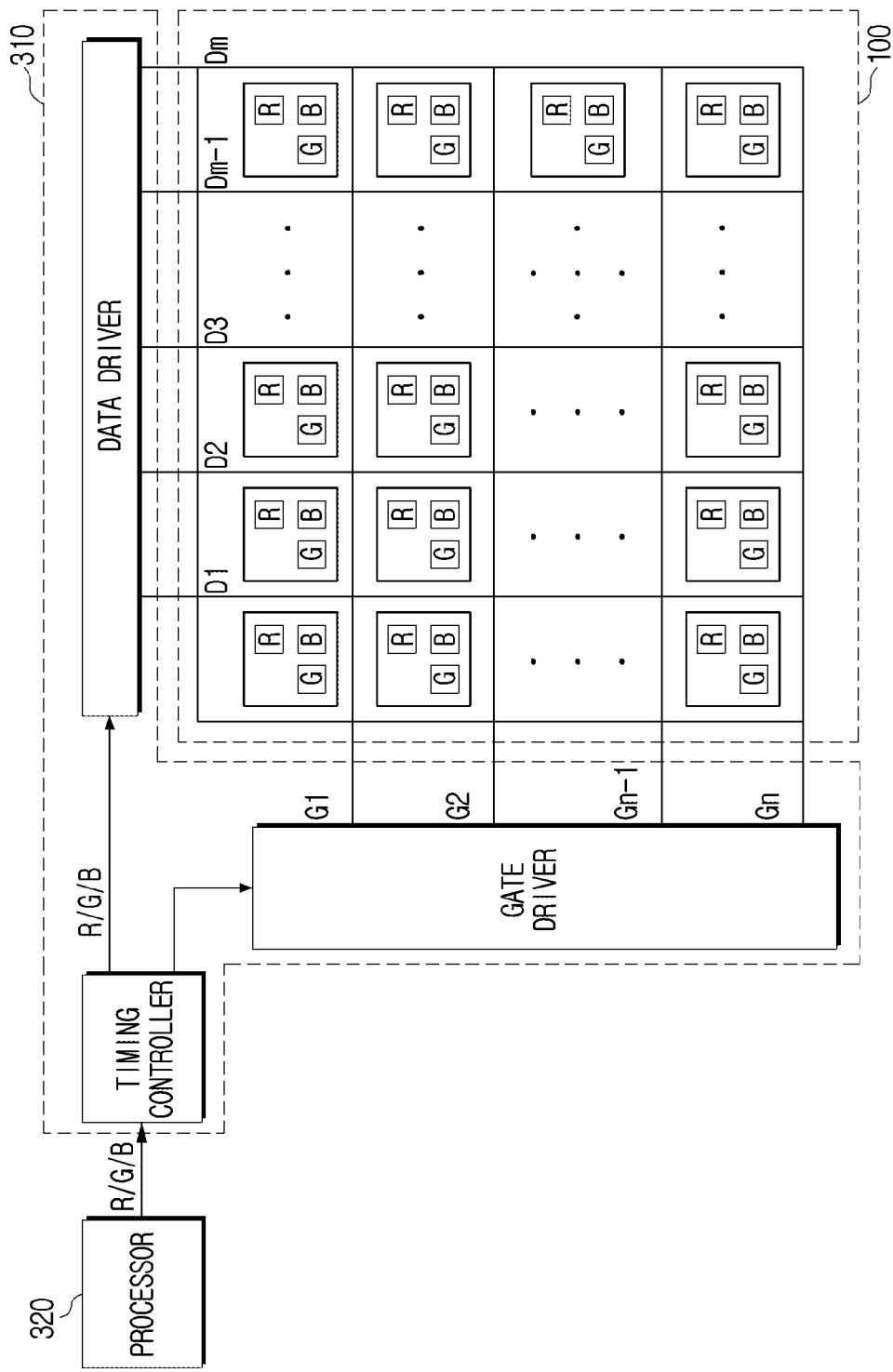
FIG. 3 is a diagram illustrating an example structure of a display panel according to various embodiments.

FIG. 3 is a diagram illustrating an example structure of the display panel 100 according to various embodiments.

The display panel 100 may be a configuration of an electronic device, and the electronic device may further include a panel driver (e.g., including panel driving circuitry) 310 and a processor (e.g., including processing circuitry) 320.

The display 100 may include the plurality of light-emitting devices 110 comprising the plurality of sub pixels. In addition, although not illustrated in FIG. 3 for convenience of description, the plurality of driving circuits 120 may be configured to control the plurality of sub pixels.

The display panel 100 may be configured such that gate lines G1 to Gn and data lines D1 to Dm are formed to inter-cross, and the driving circuit may be formed at an area provided by the inter-crossing.

The panel driver 310 may include various driving circuitry configured to transmit a control signal to the respective driving circuits 120 under the control of the processor 320, and may include, for example, and without limitation, a timing controller, a data driver, and a gate driver.

The timing controller may be configured to receive an input signal (IS), a horizontal synchronization signal (Hsync), a vertical synchronization signal (Vsync), a main clock signal (MCLK), and the like from an outside to generate an image data signal, a scan control signal, a data control signal, an emission control signal, and the like and provide to the display panel 100, a data driver, a gate driver, and the like.

For example, the timing controller may be configured to apply at least one from among the various signals (EM, Vini, SC1(n), SC2(n), and SC2(n−1)) to the driving circuit. In addition, according to an embodiment, a control signal (MUX Sel R, G, B) for selecting one sub pixel from among the R, G and B sub pixels may be applied to the driving circuit.

The data driver (or source driver) may include various circuitry and generate a data signal, and may generate a data voltage (e.g., PWM data voltage, PAM data voltage) by receiving image data of the R/G/B component from the processor 320. In addition, the data driver may be configured to apply the generated data signal to the display panel 100.

The gate driver may include various circuitry and generate various control signals such as a control signal(SPWM (n)), a control signal(SPAM), and the like, and configured to transfer the generated various control signals to a specific row (or, a specific horizontal line), or to all the lines of the display panel 100.

In addition, the gate driver may be configured to apply a driving voltage (VDD) to a driving voltage terminal of the driving circuit according to an embodiment.

The data driver and the gate driver may be realized to be included in a TFT layer formed at one surface of a substrate of the display panel 100, or realized as a separate semiconductor integrated circuit (IC) and disposed at the other side of the substrate.

The processor 320 may include various processing circuitry and be configured to control the overall operation of the electronic device which includes the display panel 100. For example, based on the processor 320 being be configured to drive the display panel 100 by controlling the panel driver 310, and the driving circuit may be configured to perform the above-described operations.

In FIG. 3, although the processor 320 and the time controller have been described as separate elements, the disclosure is not limited thereto. For example, the time controller may perform, without the processor 320, a function of the processor 320, and the processor 320 and the time controller may be realized as one configuration.

The operations of various example embodiments the disclosure will be described in greater detail below with reference to the drawings.

Figure 4:
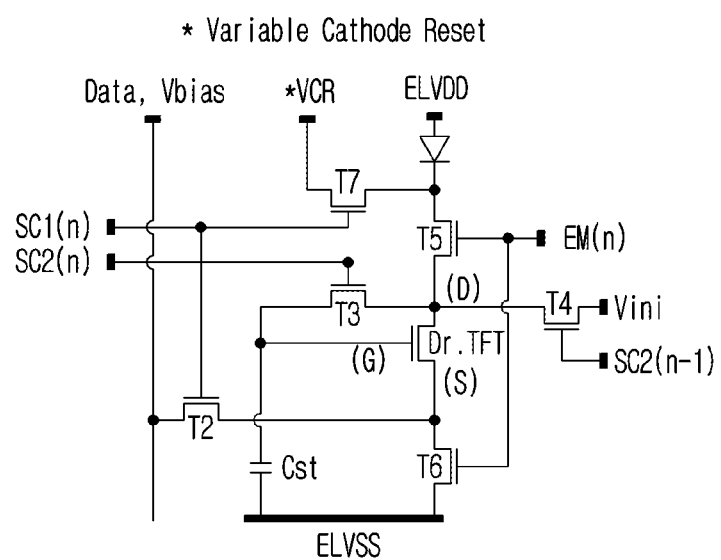
FIG. 4 is a circuit diagram illustrating an example circuit structure of a driving circuit according to various embodiments.

FIG. 4 is a circuit diagram illustrating an example circuit structure of a driving circuit according to various embodiments. In FIG. 4, a N-type metal-oxide-semiconductor low-temperature polycrystalline silicon hybrid oxide and polycrystalline silicon (NMOS LTPS HOP) pixel circuit may be described.

The driving circuit may include a first transistor (Driving TFT (Dr. TFT)), a second transistor T2 configured such that any one from among the drain terminal and the source terminal of the second transistor T2 is connected to the source terminal of the first transistor (Dr. TFT), a third transistor T3 configured such that any one from among the drain terminal and the source terminal of the third transistor T3 is connected to the gate terminal of the first transistor (Dr. TFT) and the other of the drain terminal or the source terminal of the third transistor T3 is connected to the drain terminal of the first transistor (Dr. TFT), a fourth transistor T4 configured such that any one from among the drain terminal and the source terminal of the fourth transistor T4 is connected to the drain terminal of the first transistor (Dr. TFT), a fifth transistor T5 configured such that any one from among the drain terminal and the source terminal of the fifth transistor T5 is connected to a cathode of the light-emitting device and the other of the drain terminal or the source terminal of the fifth transistor T5 is connected to the drain terminal of the first transistor (Dr. TFT), a sixth transistor T6 configured such that any one from among the drain terminal and the source terminal of the sixth transistor T6 is connected to the source terminal of the first transistor (Dr. TFT), a seventh transistor T7 configured such that any one from among the drain terminal and the source terminal of the seventh transistor T7 is connected to a cathode of the light-emitting device, and a capacitor (storage capacitance (Cst)) configured such that one end is connected to the gate terminal of the first transistor (Dr. TFT).

The first transistor (Dr. TFT), the second transistor T2, the fourth transistor T4, the fifth transistor T5, the sixth transistor T6, and the seventh transistor T7 may respectively be a NMOS LTPS TFT, and the third transistor T3 may be a NMOS Oxide TFT.

The second transistor T2 may be a switching TFT, and the gate terminal of the second transistor T2 and the gate terminal of the seventh transistor T7 may be configured to receive a first scan signal (SC1(n)).

The gate terminal of the third transistor T3 may be configured to receive a second scan signal (SC2(n)), and the gate terminal of the fourth transistor T4 may receive a third scan signal (SC2(n−1)) and initialize the gate node of the first transistor (Dr. TFT).

The first scan signal and the second scan signal may be signals for controlling a first sub pixel from among the plurality of sub pixels, and the third scan signal may be a signal for controlling a second sub pixel disposed at an upper end of the first sub pixel from among the plurality of sub pixels. For example, n may refer, for example, to a current sub pixel, n−1 may refer, for example, to the sub pixel at the upper end of the current sub pixel, and the third scan signal may be a signal used in the sub pixel at the upper end of the current sub pixel. For example, based on describing based on the R sub pixel at a left upper end, the third scan signal may be a signal for controlling the R sub pixel at the left upper end, and the first scan signal and the second scan signal may be signals for controlling the R sub pixel adjacent to the lower end of the R sub pixel at the left upper end.

Accordingly, the scan driver for controlling the current sub pixel may be the first scan signal and the second scan signal.

The other from among the drain terminal and the source terminal of the second transistor T2 may be configured to receive the data signal (Data). The data signal may be different when operating in an address scan and when operating in a self scan. For example, the data signal may be data value when operating in the address scan, but may be Vbias voltage when operating (low frequency driving) in the self scan.

The other from among the drain terminal and the source terminal of the fourth transistor T4 may be configured to receive a first initialization signal (Vini). The screen blurring by hysteresis may be improved by minimizing and/or reducing data effect of the previous frame by the first initialization signal (Vini).

The other from among the drain terminal and the source terminal of the seventh transistor T7 may be configured to receive a second initialization signal (variable cathode reset (VCR)) and initialize a cathode node of the light-emitting device. The second initialization signal (VCR) may be different when operating in the address scan and when operating in the self scan. For example, the second initialization signal (VCR) may be a VCR(A) voltage when operating in the address scan, but may be a VCR(B) voltage when operating in the self scan.

The gate terminal of the fifth transistor T5 and the gate terminal of the sixth transistor T6 may be configured to receive a light-emitting signal (EM(n)), and based on the light-emitting signal being a low voltage, the emission of the light-emitting device may be inhibited.

An anode of the light-emitting device may be connected to a first power source (ELVDD), and the other from among the drain terminal and the source terminal of the sixth transistor T6 and other end of the capacitor may be connected to a second power source (ELVSS).

Figure 1B:
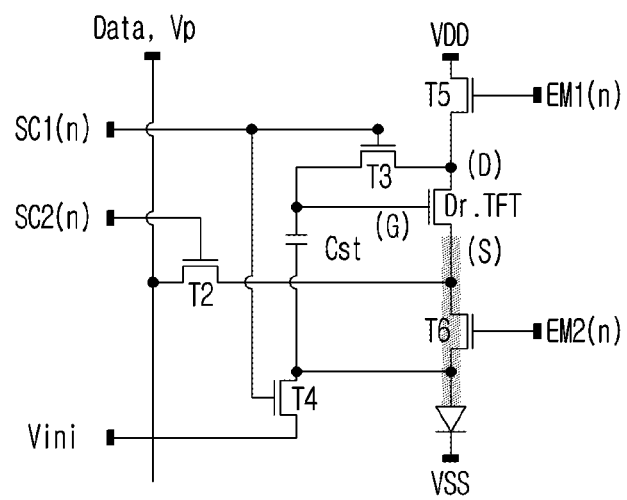
Figure 1C:
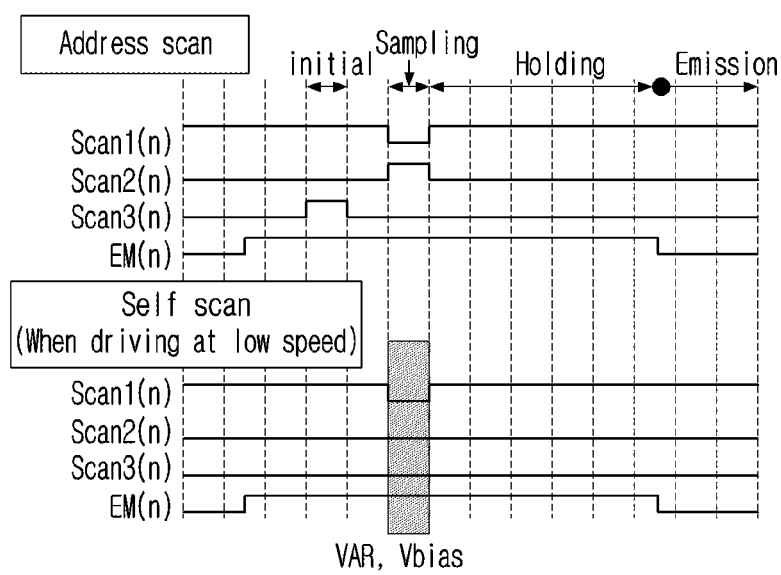
Figure 1D:
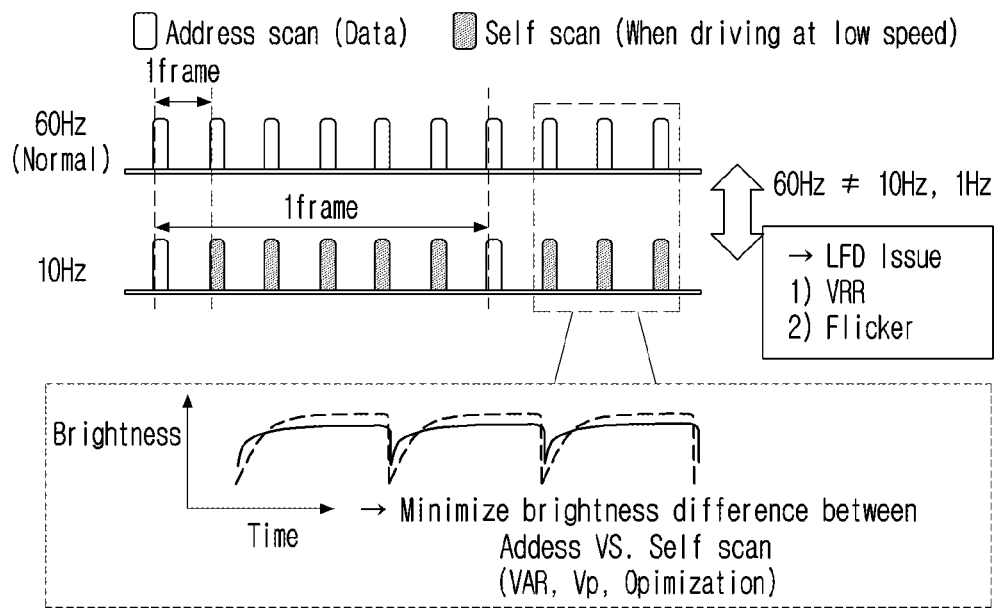

Referring to FIG. 4, a total of three transistor driving drivers from the two scan signals for controlling the current sub pixel to even the light-emitting signal may be used, and because this is one less than the related art (e.g., FIG. 1A or FIG. 1B), reduction in power consumption and in bezel size may be possible.

In addition, an anode node of the light-emitting device may be connected to the first power source (ELVDD) and a cathode node may be connected to a drain of the first transistor (Dr. TFT), and the mura according to the device distribution of the light-emitting device may be improved. For example, based on the cathode of the light-emitting device being connected to a source of the first transistor (Dr. TFT; e.g., FIG. 1B), the brightness may be changed because the Vgs is changed, but this problem may be addressed according to the disclosure.

Further, based on the fourth transistor T4 being connected to a drain node of the first transistor (Dr. TFT), an instantaneous image sticking such as screen blurring may be improved. The screen blurring may refer, for example, to a phenomenon of a brightness of a first frame becoming dark when the screen is changed, and may be a problem generated by a hysteresis difference when sampling according to the brightness of a previous frame because the source node of the first transistor (Dr. TFT) is floated in an initialization step. According to the disclosure, a specific voltage (first initialization signal (Vini)) may be applied to the source node of the first transistor (Dr. TFT) being floated from a third time period and maintaining a same brightness regardless of the previous frame may be possible. The third time period may be an initial time period of FIG. 5, and the first transistor (Dr. TFT) may be turned-on according to the third transistor T3 being turned-on, and accordingly, the specific voltage (first initialization signal (Vini)) applied to the drain node of the first transistor (Dr. TFT) may also be applied to the source node, and the source node of the first transistor (Dr. TFT) may be prevented from being floated, and the instantaneous image sticking such as the screen blurring may be improved.

In addition, the number of Oxide TFTs may be reduced by one compared to the related art.

Based on operating in the self scan, brightness may be compensated through Vbias and VCR(B) voltage as in the above-described example.

Figure 5:
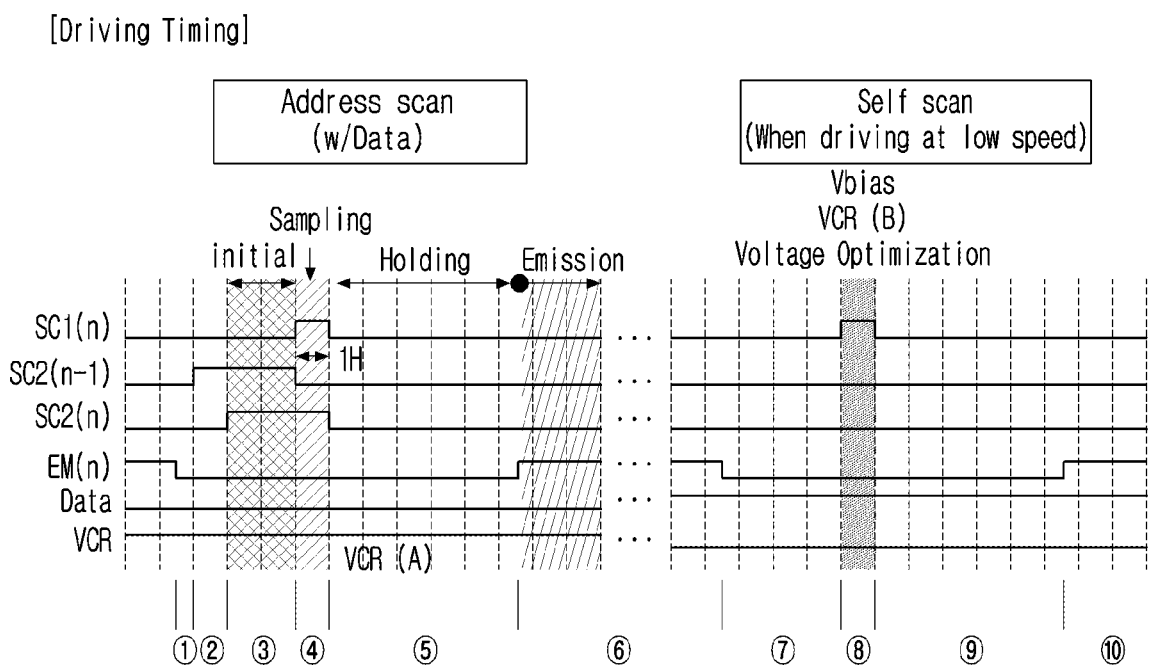
FIG. 5 is a timing diagram illustrating an example control signal according to various embodiments.

FIG. 5 is a timing diagram illustrating an example control signal according to various embodiments. In describing FIG. 5, a driving circuit state for respective steps will be described through FIGS. 6, 7, 8 and 9 (which may be referred to as FIG. 6 to FIG. 9). In FIG. 6 to FIG. 9, an 'x' mark represents the transistor being in a turned-off state, and a part marked as a shadow along the circuit represents a state in which the voltage level is the same.

Operating in the address scan will be described in greater detail below.

The first scan signal (SC1(n)), the second scan signal (SC2(n)), the third scan signal (SC2(n−1)), and the light-emitting signal (EM(n)) may respectively be low voltages during the first time period (①).

The fourth transistor T4 may be turned-on based on the third scan signal (SC2(n−1)) being changed to a high voltage during a second time period (②) directly after the first time period (①), and the first initialization signal (Vini) may be a pre-set first initialization value, and may be applied to the drain terminal of the first transistor (Dr. TFT) according to the fourth transistor T4 being turned-on.

For example, based on the fourth transistor T4 being turned-on, the first initialization signal (Vini) may be charged in the drain terminal of the first transistor (Dr. TFT).

The third transistor T3 may be turned-on based on the second scan signal (SC2(n)) being changed to a high voltage during a third time period (③) directly after the second time period (②), and the first initialization signal (Vini) may be applied to the gate terminal of the first transistor (Dr. TFT) according to the third transistor T3 being turned-on. The first initialization signal (Vini) may be voltage which may turn-on the first transistor (Dr. TFT). Further, a high voltage applying time of the second scan signal (SC2(n)) may be controllable.

Figure 6:
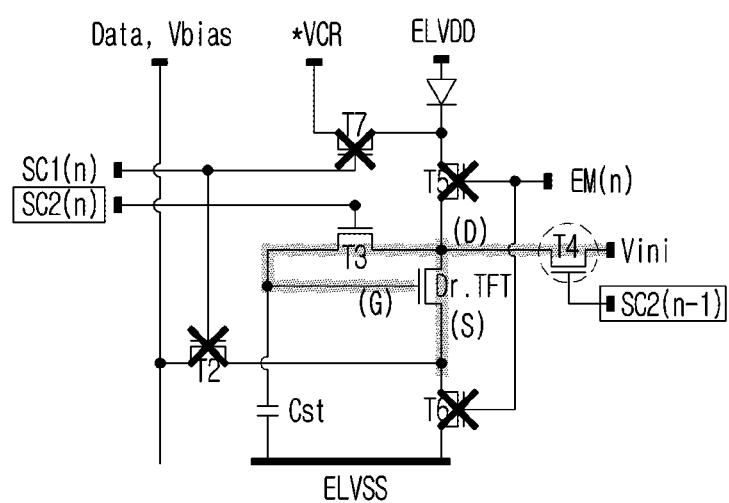
FIG. 6 is a circuit diagram illustrating an example initialization operation when operating in an address scan according to various embodiments.

For example, as illustrated in FIG. 6, based on the third transistor T3 being turned-on, the gate terminal of the first transistor (Dr. TFT) may be initialized to the first initialization signal (Vini).

The second transistor T2 and the seventh transistor T7 may be turned-on based on the first scan signal (SC1(n)) being changed to a high voltage during a fourth time period (④) directly after the third time period (③), the fourth transistor T4 may be turned-off based on the third scan signal (SC2(n−1)) being changed to a low voltage during the fourth time period (④), the data signal may be a first data value, and may be applied to the gate terminal, the drain terminal and the source terminal of the first transistor (Dr. TFT) according to the second transistor T2 being turned-on, and the second initialization signal (VCR) may be a pre-set second initialization value (VCR(A)), and may be applied to the cathode of the light-emitting device according to the seventh transistor T7 being turned-on.

Figure 7:
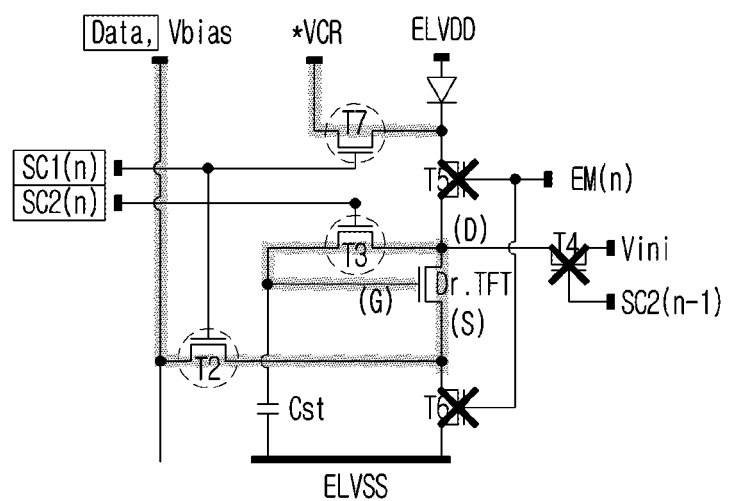
FIG. 7 is a circuit diagram illustrating an example sampling operation when operating in an address scan according to various embodiments.

For example, as illustrated in FIG. 7, based on the second transistor T2 being turned-on, the data signal may be applied to the gate terminal of the first transistor (Dr. TFT), and brightness may be determined based on the data signal applied to the gate terminal of the first transistor (Dr. TFT) in the light-emitting step thereafter.

The second transistor T2 and the seventh transistor T7 may be turned-off based on the first scan signal (SC1(n)) being changed to a low voltage during a fifth time period (⑤) directly after the fourth time period (④), the third transistor T3 may be turned-off based on the second scan signal (SC2(n)) being changed to a low voltage during the fifth time period (⑤), and the data signal may be maintained in the gate terminal, the drain terminal and the source terminal of the first transistor (Dr. TFT) through the capacitor.

The fifth transistor T5 and the sixth transistor T6 may be turned-on based on the light-emitting signal (EM(n)) being changed to a high voltage during a sixth time period (⑥) directly after the fifth time period (⑤), and the light-emitting device may be configured to emit light according to the fifth transistor T5 and the sixth transistor T6 being turned-on.

Figure 8:
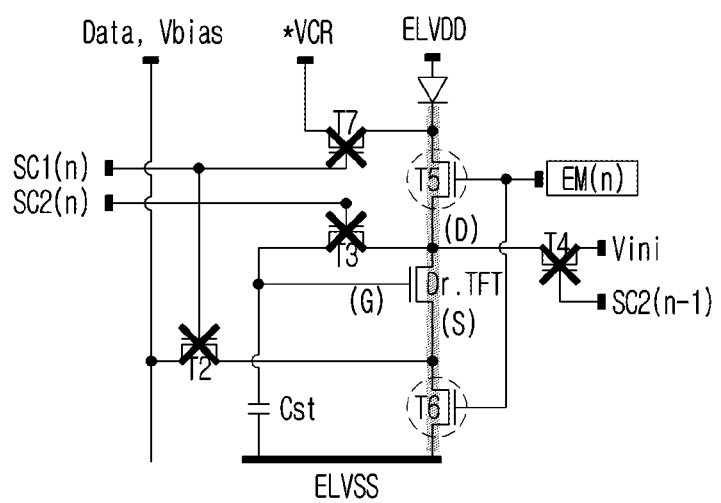
FIG. 8 is a circuit diagram illustrating an example emission operation when operating in an address scan according to various embodiments.

For example, as illustrated in FIG. 8, based on the fifth transistor T5 and the sixth transistor T6 being turned-on, current may flow in the light-emitting device, and the size of the current may be determined based on the data value applied to the gate terminal of the first transistor (Dr. TFT). The light-emitting device may be configured such that brightness may be changed based on the size of the current.

The fifth transistor T5 and the sixth transistor T6 may be turned-off based on the light-emitting signal (EM(n)) being changed to a low voltage during a seventh time period (⑦) directly after the sixth time period (⑥), and the light-emitting device may be configured to stop emission according to the fifth transistor T5 and the sixth transistor T6 being turned-off.

Operating in the self scan will be described in greater detail below.

The second transistor T2 and the seventh transistor T7 may be turned-on according to the first scan signal (SC1(n)) being changed to a high voltage based on the display panel 100 being changed from a first mode to a second mode during an eighth time period (⑧) directly after the seventh time period (⑦), the data signal may be a second data value (Vbias) obtained based on the first data value, and may be applied to the drain terminal and the source terminal of the first transistor (Dr. TFT) according to the second transistor T2 being turned-on, and the second initialization signal (VCR) may be a pre-set third initialization value (VCR(B)), and may be applied to the cathode of the light-emitting device according to the seventh transistor T7 being turned-on. The pre-set third initialization value (VCR(B)) may be less than the pre-set second initialization value (VCR(A)). Further, the display panel 100 may be changed from the first mode to the second mode based on a used state of the display panel 100.

Figure 9:
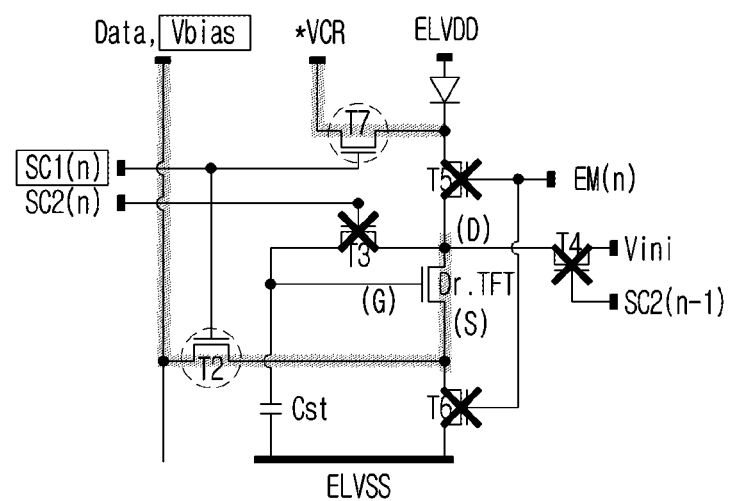
FIG. 9 is a circuit diagram illustrating an example sampling operation when operating in a self scan according to various embodiments.

For example, as illustrated in FIG. 9, based on the display panel 100 operating from the address scan to the self scan, the data signal may be applied to the drain terminal and the source terminal of the first transistor (Dr. TFT) according to the second transistor T2 being turned-on, and the second initialization signal (e.g., third initialization value (VCR(B))) may be applied to the cathode of the light-emitting device according to the seventh transistor T7 being turned-on. The data signal and the second initialization signal (e.g., third initialization value (VCR(B))) may be different from the data signal and the second initialization signal (e.g., second initialization value (VCR(A))) which are applied when operating in the address scan. For example, the gate terminal of the first transistor (Dr. TFT) may be configured such that the data signal applied when operating in the address scan by the capacitor is maintained, but there may be slight differences in the turn-on state of the respective transistors when operating in the address scan and when operating in the self scan, and a difference in brightness may occur accordingly when operating in the address scan and when operating in the self scan. The data signal (e.g., second data value (Vbias)) and the second initialization signal (e.g., third initialization value(VCR(B))) which are applied when operating in the self scan may be signals for compensating the brightness difference.

The second transistor T2 and the seventh transistor T7 may be turned-off based on the first scan signal (SC1(n)) being changed to a low voltage during a ninth time period (⑨) directly after the eighth time period (⑧).

The fifth transistor T5 and the sixth transistor T6 may be turned-on based on the light-emitting signal (EM(n)) being changed to a high voltage during a tenth time period (⑩) directly after the ninth time period (⑨), and the light-emitting device may be configured to emit light according to the fifth transistor T5 and the sixth transistor T6 being turned-on.

The fifth transistor T5 and the sixth transistor T6 may be turned-off based on the light-emitting signal (EM(n)) being changed to a low voltage during an eleventh time period directly after the tenth time period (⑩), and the light-emitting device may be configured to stop emission according to the fifth transistor T5 and the sixth transistor T6 being turned-off.

Figure 10:
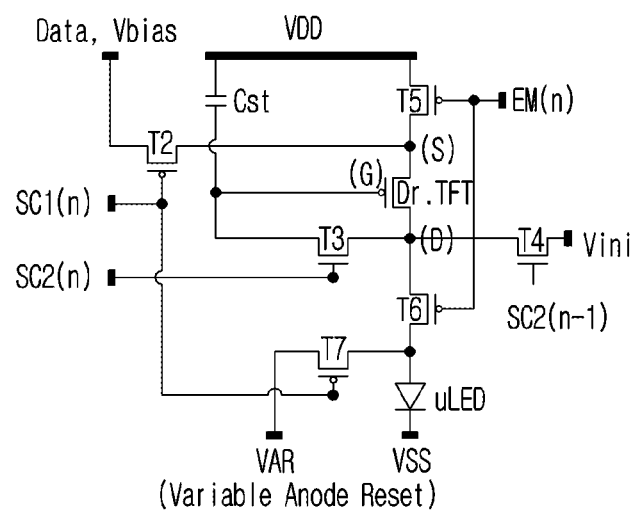
FIG. 10 is a circuit diagram illustrating an example circuit structure of a driving circuit according to various embodiments.

FIG. 10 is a circuit diagram illustrating an example circuit structure of a driving circuit according to various embodiments. In FIG. 10, a P-type metal-oxide-semiconductor low-temperature polycrystalline silicon hybrid oxide and polycrystalline silicon (PMOS LTPS HOP) pixel circuit is described by way of non-limiting example.

The driving circuit may include a first transistor (Driving TFT (Dr. TFT)), a second transistor T2 configured such that any one from among the drain terminal and the source terminal of the second transistor T2 is connected to the source terminal of the first transistor (Dr. TFT), a third transistor T3 configured such that any one from among the drain terminal and the source terminal of the third transistor T3 is connected to the gate terminal of the first transistor (Dr. TFT) and the other of the drain terminal and the source terminal of the third transistor T3 is connected to the drain terminal of the first transistor (Dr. TFT), a fourth transistor T4 configured such that any one from among the drain terminal and the source terminal of the fourth transistor T4 is connected to the drain terminal of the first transistor (Dr. TFT), a fifth transistor T5 configured such that any one from among the drain terminal and the source terminal of the fifth transistor T5 is connected to the source terminal of the first transistor (Dr. TFT), a sixth transistor T6 configured such that any one from among the drain terminal and the source terminal of the sixth transistor T6 is connected to the anode of the light-emitting device and the other of the drain terminal and the source terminal of the sixth transistor T6 is connected to the drain terminal of the first transistor (Dr. TFT), a seventh transistor T7 configured such that any one from the drain terminal and the source terminal of the seventh transistor T7 is connected to the anode of the light-emitting device, and a capacitor (Cst) configured such that one end is connected to the gate terminal of the first transistor (Dr. TFT).

The first transistor (Dr. TFT), the second transistor T2, the fifth transistor T5, the sixth transistor T6, and the seventh transistor T7 may respectively be a P-type metal-oxide-semiconductor (PMOS) LTPS TFT, and the third transistor T3 and the fourth transistor T4 may respectively be the NMOS Oxide TFT.

The second transistor T2 may be a switching TFT, and the gate terminal of the second transistor T2 and the gate terminal of the seventh transistor T7 may be configured to receive the first scan signal (SC1(n)).

The gate terminal of the third transistor T3 may be configured to receive the second scan signal (SC2(n)), and the gate terminal of the fourth transistor T4 may be configured to receive the third scan signal (SC2(n−1)) and initialize the gate node of the first transistor (Dr. TFT).

The first scan signal (SC1(n)) and the second scan signal (SC2(n)) may be signals for controlling the first sub pixel from among the plurality of sub pixels, and the third scan signal (SC2(n−1)) may be a signal for controlling the second sub pixel disposed at an upper end of the first sub pixel from among the plurality of sub pixels. For example, n may refer, for example, to the current sub pixel, n−1 may refer, for example, to the sub pixel at the upper end of the current sub pixel, and the third scan signal (SC2(n−1)) may be a signal used in the sub pixel at the upper end of the current sub pixel. For example, based on describing based on the R sub pixel at a left upper end in FIG. 3, the third scan signal may be a signal for controlling the R sub pixel at the left upper end, and the first scan signal and the second scan signal may be signals for controlling the R sub pixel adjacent to the lower end of the R sub pixel at the left upper end. Accordingly, the scan driver for controlling the current sub pixel may be the first scan signal (SC1(n)) and the second scan signal (SC2(n)).

The other from among the drain terminal and the source terminal of the second transistor T2 may be configured to receive the data signal (Data). The data signal may be different when operating in the address scan and when operating in the self scan. For example, the data signal may be the data value when operating in the address scan, but may be the Vbias voltage when operating in the self scan.

The other from among the drain terminal and the source terminal of the fourth transistor T4 may be configured to receive the first initialization signal (Vini). The screen blurring by hysteresis may be improved by minimizing and/or reducing the data effect of the previous frame by the first initialization signal (Vini).

The other from among the drain terminal and the source terminal of the seventh transistor T7 may be configured to receive the second initialization signal (variable cathode reset (VAR)) and initialize the anode node of the light-emitting device. The second initialization signal (VAR) may be different when operating in the address scan and when operating in the self scan. For example, the second initialization signal (VAR) may be a VAR(A) voltage when operating in the address scan, but may be a VAR(B) voltage when operating in the self scan.

The gate terminal of the fifth transistor T5 and the gate terminal of the sixth transistor T6 may be configured to receive the light-emitting signal (EM(n)), and based on the light-emitting signal (EM(n)) being a high voltage, the emission of the light-emitting device may be inhibited.

The other from among the drain terminal and the source terminal of the fifth transistor T5 and the other end of the capacitor may be connected to a first power source (VDD), and the cathode of the light-emitting device may be connected to a second power source (VSS).

Referring to FIG. 10, a total of three transistor driving drivers from the two scan signals for controlling the current sub pixel to even the light-emitting signal (EM(n)) may be used, and because this is one less than the related art (e.g., FIG. 1A or FIG. 1B), reduction in power consumption and in bezel size may be possible.

Further, based on the fourth transistor T4 being connected to the drain node of the first transistor (Dr. TFT), the instantaneous image sticking such as the screen blurring may be improved. The screen blurring may be the phenomenon of the brightness of the first frame becoming dark when the screen is changed, and may be a problem generated by the hysteresis difference when sampling according to the brightness of the previous frame because the source node of the first transistor (Dr. TFT) is floated in the initialization step of the related art. According to the disclosure, a specific voltage (first initialization signal (Vini)) may be applied to the source node of the first transistor (Dr. TFT) being floated from the third time period and maintaining the same brightness regardless of the previous frame may be possible. The third time period may be the initial time period of FIG. 11, and the first transistor (Dr. TFT) may be turned-on according to the third transistor T3 being turned-on, and accordingly, the specific voltage (first initialization signal (Vini)) applied to the drain node of the first transistor (Dr. TFT) may also be applied to the source node, and the source node of the first transistor (Dr. TFT) may be prevented from being floated, and the instantaneous image sticking such as the screen blurring may be improved.

Based on operating in the self scan, brightness may be compensated through Vbias and VCR(B) voltage as in the above-described example.

Figure 11:
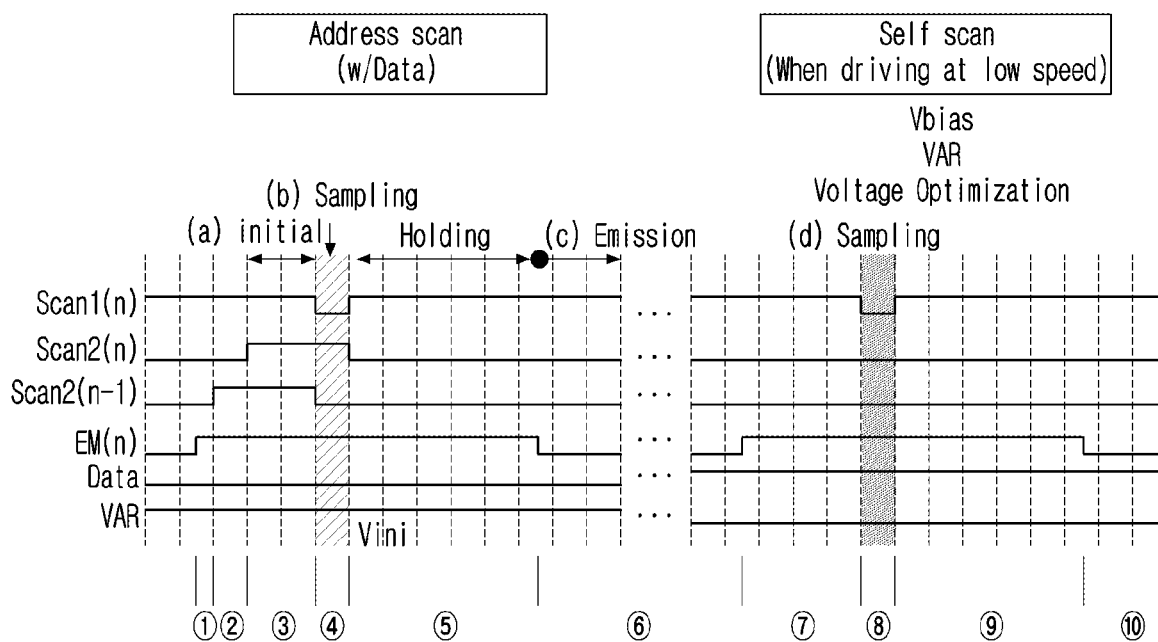
FIG. 11 is a timing diagram illustrating an example control signal according to various embodiments.

FIG. 11 is a timing diagram illustrating an example control signal according to various embodiments. In describing FIG. 11, the driving circuit state for the respective steps will be described through FIGS. 12, 13, 14 and 15 (which may be referred to as FIG. 12 to FIG. 15). In FIG. 12 to FIG. 15, the 'x' mark represents the transistor being in the turned-off state, and the part marked as the shadow along the circuit represents the state in which the voltage level is the same.

Operating in the address scan will be described in greater detail below.

During the first time period (①), the first scan signal (SC1(n)) and the light-emitting signal (EM(n)) may respectively be high voltages, and the second scan signal (SC2(n)) and the third scan signal (SC2(n−1)) may respectively be low voltages.

The fourth transistor T4 may be turned-on based on the third scan signal (SC2(n−1)) being changed to a high voltage during the second time period (②) directly after the first time period (①), and the first initialization signal (Vini) may be the pre-set first initialization value and applied to the drain terminal of the first transistor (Dr. TFT) according to the fourth transistor T4 being turned-on.

For example, based on the fourth transistor T4 being turned-on, the first initialization signal (Vini) may be charged in the drain terminal of the first transistor (Dr. TFT).

The third transistor T3 may be turned-on based on the second scan signal (SC2(n)) being changed to a high voltage during the third time period (③) directly after the second time period (②), and the first initialization signal (Vini) may be applied to the gate terminal of the first transistor (Dr. TFT) according to the third transistor T3 being turned-on. The first initialization signal (Vini) may be voltage which may turn-on the first transistor (Dr. TFT). Further, the high voltage applying time of the second scan signal (SC2(n)) may be controllable.

Figure 12:
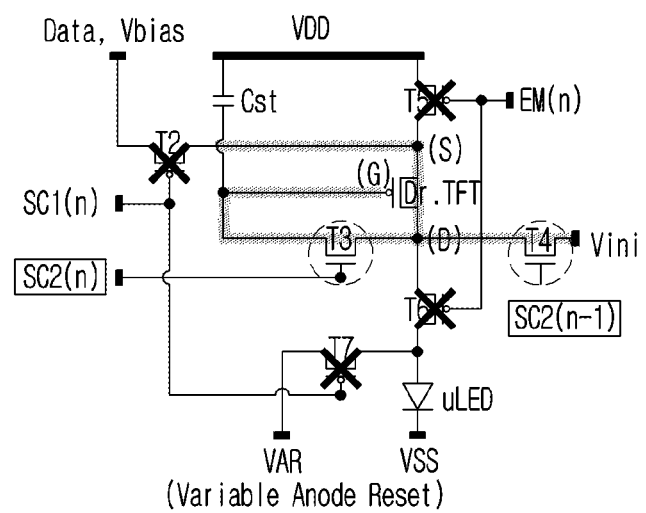
FIG. 12 is a circuit diagram illustrating an example initialization operation when operating in an address scan according to various embodiments.

For example, as illustrated in FIG. 12, based on the third transistor T3 being turned-on, the gate terminal of the first transistor (Dr. TFT) may be initialized to the first initialization signal (Vini).

The second transistor T2 and the seventh transistor T7 may be turned-on based on the first scan signal (SC1(n)) being changed to a low voltage during the fourth time period (④) directly after the third time period (③), the fourth transistor T4 may be turned-off based on the third scan signal (SC2(n−1)) being changed to a low voltage during the fourth time period (④), the data signal may be the first data value, and may be applied to the gate terminal, the drain terminal and the source terminal of the first transistor (Dr. TFT) according to the second transistor T2 being turned-on, and the second initialization signal(VAR) may be the pre-set second initialization value (VAR(A)), and may be applied to the anode of the light-emitting device according to the seventh transistor T7 being turned-on.

Figure 13:
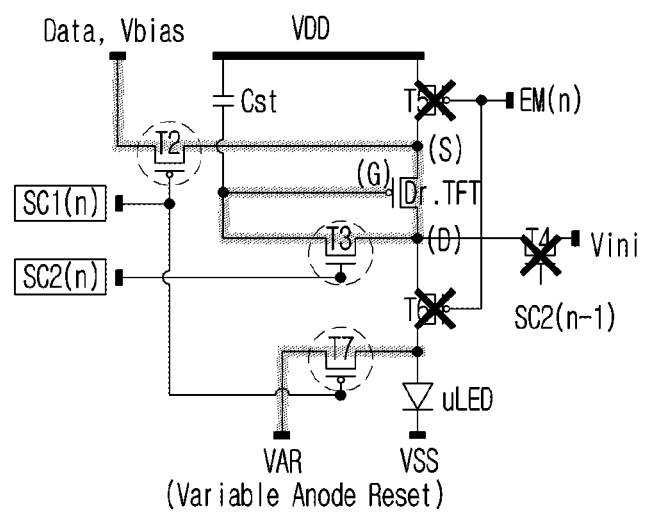
FIG. 13 is a circuit diagram illustrating an example sampling operation when operating in an address scan according to various embodiments.

For example, as illustrated in FIG. 13, based on the second transistor T2 being turned-on, the data signal may be applied to the gate terminal of the first transistor (Dr. TFT), and brightness may be determined based on the data signal applied to the gate terminal of the first transistor (Dr. TFT) in the light-emitting step thereafter.

The second transistor T2 and the seventh transistor T7 may be turned-off based on the first scan signal (SC1(n)) being changed to a high voltage during the fifth time period (⑤) directly after the fourth time period (⑧), the third transistor T3 may be turned-off based on the second scan signal (SC2(n)) being changed to a low voltage during the fifth time period (⑤), and the data signal may be maintained in the gate terminal, the drain terminal and the source terminal of the first transistor (Dr. TFT) through the capacitor.

The fifth transistor T5 and the sixth transistor T6 may be turned-on based on the light-emitting signal (EM(n)) being changed to a low voltage during the sixth time period (⑥) directly after the fifth time period (⑤), and the light-emitting device may be configured to emit light according to the fifth transistor T5 and the sixth transistor T6 being turned-on.

Figure 14:
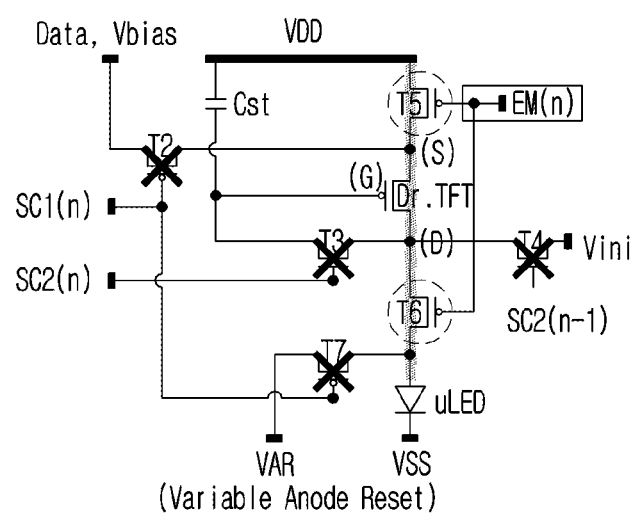
FIG. 14 is a circuit diagram illustrating an example emission operation when operating in an address scan according to various embodiments.

For example, as illustrated in FIG. 14, based on the fifth transistor T5 and the sixth transistor T6 being turned-on, current may flow in the light-emitting device, and the size of the current may be determined based on the data value applied to the gate terminal of the first transistor (Dr. TFT). The light-emitting device may be configured such that brightness may be changed based on the size of the current.

The fifth transistor T5 and the sixth transistor T6 may be turned-off based on the light-emitting signal (EM(n)) being changed to a high voltage during the seventh time period (⑦) directly after the sixth time period (⑥), and the light-emitting device may be configured to stop emission according to the fifth transistor T5 and the sixth transistor T6 being turned-off.

Operating in the self scan will be described in greater detail below.

The second transistor T2 and the seventh transistor T7 may be turned-on according to the first scan signal (SC1(n)) being changed to a low voltage based on the display panel 100 being changed from the first mode to the second mode during the eighth time period (⑧) directly after the seventh time period (⑦), the data signal may be the second data value (Vbias) obtained based on the first data value, and may be applied to the drain terminal and the source terminal of the first transistor (Dr. TFT) according to the second transistor T2 being turned-on, and the second initialization signal (VAR) may be a pre-set third initialization value (VAR(B)), and may be applied to the anode of the light-emitting device according to the seventh transistor T7 being turned-on. The pre-set third initialization value (VAR(B)) may be less than the pre-set second initialization value (VAR(A)). Further, the display panel 100 may be changed from the first mode to the second mode based on the used state of the display panel 100.

Figure 15:
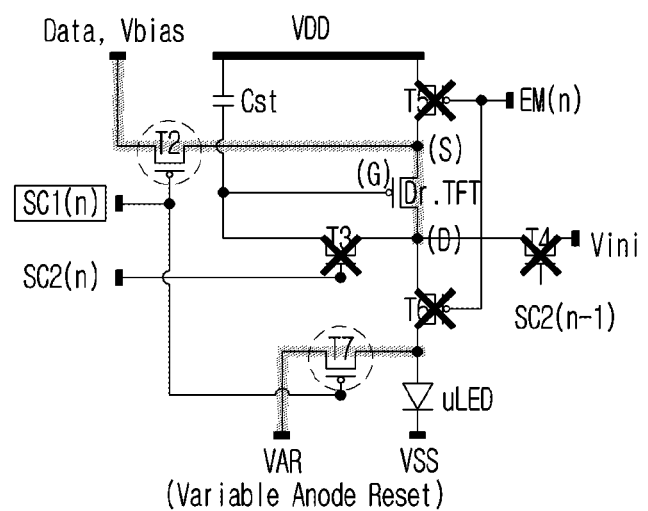
FIG. 15 is a circuit diagram illustrating an example sampling operation when operating in a self scan according to various embodiments.

For example, as illustrated in FIG. 15, based on the display panel 100 operating from the address scan to the self scan, the data signal may be applied to the drain terminal and the source terminal of the first transistor (Dr. TFT) according to the second transistor T2 being turned-on, and the second initialization signal (VAR) may be applied to the anode of the light-emitting device according to the seventh transistor T7 being turned-on. The data signal and the second initialization signal (VAR) may be different from the data signal and the second initialization signal (VAR) which are applied when operating in the address scan. For example, the gate terminal of the first transistor (Dr. TFT) may be configured such that the data signal applied when operating in the address scan by the capacitor is maintained, but there may be slight differences in the turn-on state of the respective transistors when operating in the address scan and when operating in the self scan, and a difference in brightness may occur accordingly when operating in the address scan and when operating in the self scan. The data signal and the second initialization signal (VAR) which are applied when operating in the self scan may be signals for compensating the brightness difference.

The second transistor T2 and the seventh transistor T7 may be turned-off based on the first scan signal (SC1(n)) being changed to a high voltage during the ninth time period (⑨) directly after the eighth time period (⑧).

The fifth transistor T5 and the sixth transistor T6 may be turned-on based on the light-emitting signal (EM(n)) being changed to a low voltage during the tenth time period (⑩) directly after the ninth time period (⑨), and the light-emitting device may be configured to emit light according to the fifth transistor T5 and the sixth transistor T6 being turned-on.

The fifth transistor T5 and the sixth transistor T6 may be turned-off based on the light-emitting signal (EM(n)) being changed to a high voltage during the eleventh time period directly after the tenth time period (⑩) and the light-emitting device may be configured to stop emission according to the fifth transistor T5 and the sixth transistor T6 being turned-off.

Figure 16:
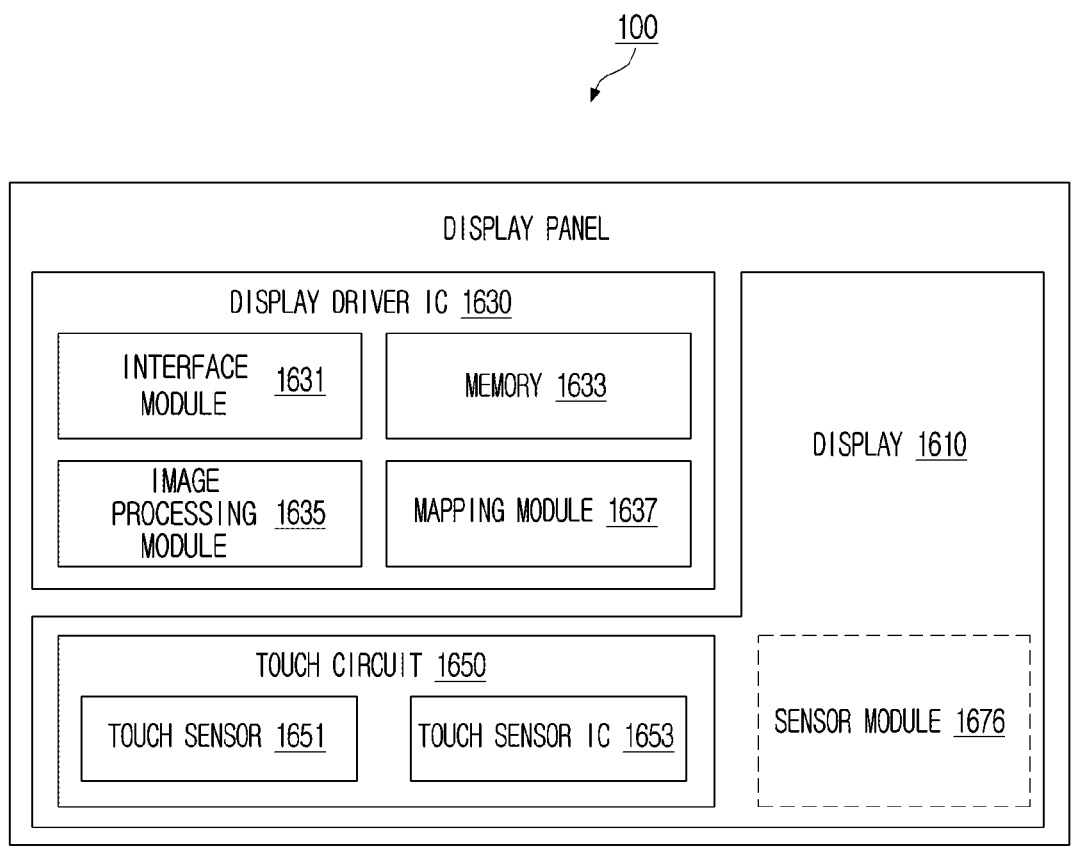
FIG. 16 is a block diagram illustrating an example configuration of a display panel according to various embodiments.

FIG. 16 is a block diagram illustrating an example configuration of the display panel 100 according to various embodiments.

Referring to FIG. 16, the display panel 100 may include a display 1610 and a display driver IC (DDI) 1630 for controlling the display. The DDI 1630 may include an interface module 1631, a memory 1633 (e.g., buffer memory), an image processing module 1635, and/or a mapping module 1637. Each of the modules may include various circuitry and/or executable program instructions, firmware, or the like. The DDI 1630 may be configured to receive, for example, an image data or image information including an image control signal corresponding to instructions for controlling the image data from another element of the electronic device which includes the display panel 100 through the interface module 1631. For example, according to an embodiment, the image information may be received from the processor (e.g., main processor (e.g., application processor)) or an auxiliary processor (e.g., graphics processing device) which is operated independently from a function of the main processor. The DDI 1630 may perform communication with a touch circuit 1650, a sensor module 1676, or the like through the interface module 1631. In addition, the DDI 1630 may be configured to store at least some from among the received image information in the memory 1633 in, for example, frame units. The image processing module 1635 may be configured to perform, for example, pre-processing or post-processing (e.g., resolution, brightness, or size adjustment) on at least some of the image data based on at least characteristics of the image data or characteristics of the display 1610. The mapping module 1637 may be configured to generate a voltage value or a current value corresponding to the pre-processed or post-processed image data through the image processing module 1635. According to an embodiment, the generating of the voltage value or the current value may be, for example, performed based at least in part on the characteristics of the pixels (e.g., arrangement of the pixels (a RGB stripe or a pentile structure), or sizes of the respective sub pixels) of the display 1610. The at least some pixels of the display 1610 may be, for example, driven based at least in part on the voltage value and the current value, and visual information (e.g., text, image, or icon) corresponding to the image data may be displayed through the display 1610.

According to an embodiment, the display panel 100 may further include the touch circuit 1650. The touch circuit 1650 may include a touch sensor 1651 and a touch sensor IC 1653 for controlling the touch sensor. The touch sensor IC 1653 may be configured to control the touch sensor 1651 to, for example, detect a touch input or a hovering input on a specific position of the display 1610. For example, the touch sensor IC 1653 may be configured to detect the touch input or the hovering input by measuring a change in signal (e.g., voltage, light amount, resistance, or charge amount) on a specific position of the display 1610. The touch sensor IC 1653 may be configured to provide information (e.g., position, area, pressure, or time) on the detected touch input or hovering input to the processor. According to an embodiment, the at least a part of the touch circuit 1650 (e.g., touch sensor IC 1653) may be included as a part of the display driver IC 1630 or the display 1610, or as a part of another element (e.g., auxiliary processor) disposed outside of the display panel 100.

According to an embodiment, the display panel 100 may further include at least one sensor (e.g., fingerprint sensor, iris sensor, pressure sensor, or illuminance sensor) of the sensor module 1676, or a control circuit on the at least one sensor. In this case, the at least one sensor or the control circuit on the at least one sensor may be embedded in a part of the display panel 100 (e.g., display 1610 or DDI 1630) or a part of the touch circuit 1650. For example, based on the sensor module 1676 embedded in the display panel 100 including a biometric sensor (e.g., fingerprint sensor), the biometric sensor may be configured to obtain biometric information (e.g., fingerprint image) associated with the touch input through some areas of the display 1610. In another example, based on the sensor module 1676 embedded in the display panel 100 including a pressure sensor, the pressure sensor may be configured to obtain pressure information associated with the touch input through some or whole area of the display 1610. According to an embodiment, the touch sensor 1651 or the sensor module 1676 may be disposed between pixels of a pixel layer of the display 1610, or over or under the pixel layer.

Figure 17:
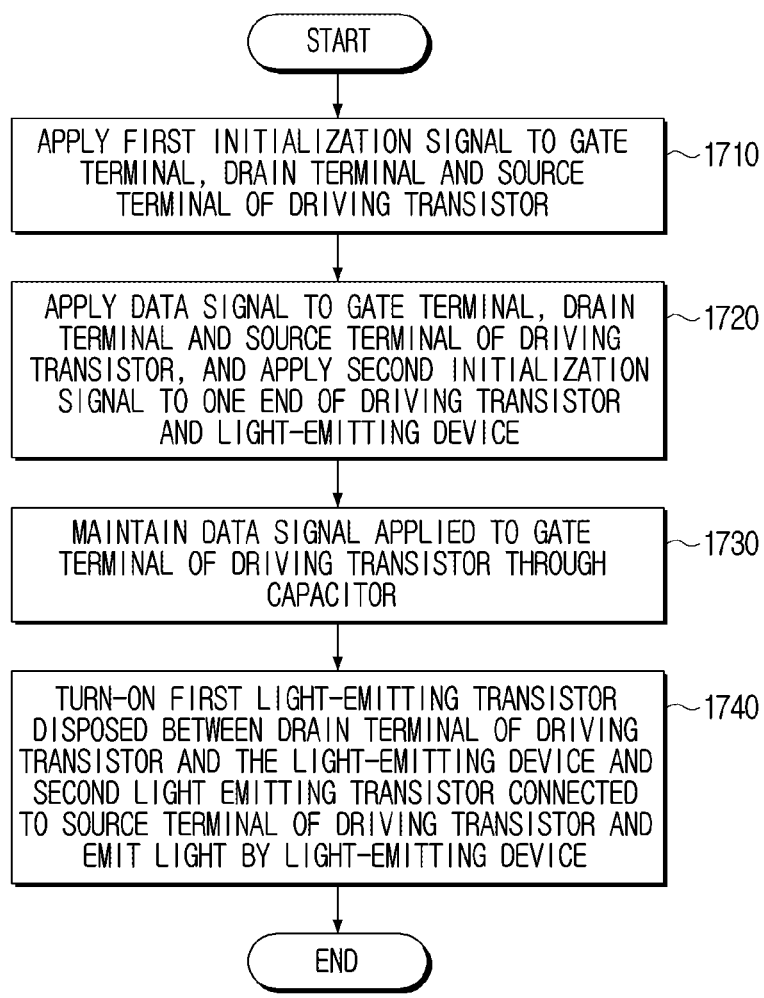
FIG. 17 is a flowchart illustrating an example method of operating a display panel according to various embodiments.

FIG. 17 is a flowchart illustrating an example method of operating a display panel according to various embodiments.

In an embodiment, the first initialization signal may be applied to the gate terminal, the drain terminal and the source terminal of a driving transistor (e.g., first transistor) (1710). If there is no first initialization signal, the source node of the first transistor may be floated and the instantaneous image sticking such as screen blurring may occur, but according to the disclosure, it may be possible to maintain the same brightness regardless of the previous frame based on the first initialization signal being applied to the source node of the first transistor. In addition, the first initialization signal may be a signal which turns-on the driving transistor.

In an embodiment, the data signal may be applied to the gate terminal, the drain terminal and the source terminal of the driving transistor, and the second initialization signal may be applied to one end of the driving transistor and the light-emitting device (1720). For example, the data signal may be applied to the gate terminal through the source terminal and the drain terminal of the driving transistor. At this time, the driving transistor may be in a turned-on state by the first initialization signal. Further, the gate terminal and the drain terminal of driving transistor may be conducted through a separate switch circuit.

In an embodiment, the data signal applied to the gate terminal of the driving transistor may be maintained through the capacitor (1730). For example, the gate terminal of the driving transistor may be configured such that the voltage is constantly maintained until an initialization voltage is applied again by the data signal applied to the capacitor.

In an embodiment, a first light-emitting transistor (e.g., fifth transistor, or sixth transistor) disposed between the drain terminal of the driving transistor and the light-emitting device and a second light-emitting transistor (e.g., fifth transistor, or sixth transistor) connected to the source terminal of the driving transistor may be turned-on and the light-emitting device may be configured to emit light (1740). A current flowing through the driving transistor may be determined according to the size of the data signal applied to the gate terminal of the driving transistor, and a brightness value of the light-emitting device may be determined according to the size of the current.

According to various embodiments of the disclosure, the respective driving circuits included in the display panel may be configured to perform low frequency driving by being realized with six-type metal-oxide-semiconductor thin film transistors (NMOS TFTs) and one Oxide TFT, or realized with five P-type metal-oxide-semiconductor thin film transistors (PMOS TFTs) and two Oxide TFTs, and the manufacturing cost, the bezel size and the power consumption may be reduced as the number of TFTs and scan drivers are reduced.

In addition, the light-emitting device may be connected to the drain node of the Driving TFT and address the mura problem according to the device distribution of the light-emitting device.

Further, hysteresis characteristics may be improved using the Driving TFT as the NMOS TFT, and thereby the occurrence of instantaneous image sticking such as the screen blurring may be reduced.

According to an example embodiment, the display panel may include: a plurality of pixels including the plurality of sub pixels, respectively, and the respective sub pixels may include: a light-emitting device comprising a light emitting diode and a driving circuit, and the driving circuit may include: a first transistor, a second transistor configured such that any one from among the drain terminal and the source terminal of the second transistor is connected to the source terminal of the first transistor, a third transistor configured such that any one from among the drain terminal and the source terminal of the third transistor is connected to the gate terminal of the first transistor and the other of the drain terminal and the source terminal of the third transistor is connected to the drain terminal of the first transistor, a fourth transistor configured such that any one from among the drain terminal and the source terminal of the fourth transistor is connected to the drain terminal of the first transistor, a fifth transistor configured such that any one from among the drain terminal and the source terminal of the fifth transistor is connected to the cathode of the light-emitting device and the other of the drain terminal and the source terminal of the fifth transistor is connected to the drain terminal of the first transistor, a sixth transistor configured such that any one from among the drain terminal and the source terminal of the sixth transistor is connected to the source terminal of the first transistor, a seventh transistor configured such that any one from among the drain terminal and the source terminal of the seventh transistor is connected to the cathode of the light-emitting device, and a capacitor configured such that one end of the capacitor is connected to the gate terminal of the first transistor.

In addition, the gate terminal of the second transistor and the gate terminal of the seventh transistor may be configured to receive the first scan signal, the gate terminal of the third transistor may be configured to receive the second scan signal, the gate terminal of the fourth transistor may be configured to receive the third scan signal, the other from among the drain terminal and the source terminal of the second transistor may be configured to receive the data signal, the other from among the drain terminal and the source terminal of the fourth transistor may be configured to receive the first initialization signal, the other from among the drain terminal and the source terminal of the seventh transistor may be configured to receive the second initialization signal, the gate terminal of the fifth transistor and the gate terminal of the sixth transistor may be configured to receive the light-emitting signal, the anode of the light-emitting device may be connected to the first power source, the other from among the drain terminal and the source terminal of the sixth transistor and the other end of the capacitor may be connected to the second power source.

Further, during a first time period, the first scan signal, the second scan signal, the third scan signal, and the light-emitting signal may respectively be low voltages, the fourth transistor may be turned-on based on the third scan signal being changed to a high voltage during the second time period directly after the first time period, and the first initialization signal may be the pre-set first initialization value, and may be applied to the drain terminal of the first transistor based on the fourth transistor being turned-on.

In addition, the third transistor may be turned-on based on the second scan signal being changed to a high voltage during the third time period directly after the second time period, and the first initialization signal may be applied to the gate terminal of the first transistor based on the third transistor being turned-on.

Further, the second transistor and the seventh transistor may be turned-on based on the first scan signal being changed to a high voltage during the fourth time period directly after the third time period, the fourth transistor may be turned-off based on the third scan signal being changed to a low voltage during the fourth time period, the data signal may be the first data value, and may be applied to the gate terminal, the drain terminal and the source terminal of the first transistor based on the second transistor being turned-on, and the second initialization signal may be the pre-set second initialization value, and may be applied to the cathode of the light-emitting device based on the seventh transistor being turned-on.

In addition, the second transistor and the seventh transistor may be turned-off based on the first scan signal being changed to a low voltage during the fifth time period directly after the fourth time period, the third transistor may be turned-off based on the second scan signal being changed to a low voltage during the fifth time period, and the data signal may be maintained in the gate terminal, the drain terminal and the source terminal of the first transistor through the capacitor.

Further, the fifth transistor and the sixth transistor may be turned-on based on the light-emitting signal being changed to a high voltage during the sixth time period directly after the fifth time period, and the light-emitting device may be configured to emit light based on the fifth transistor and the sixth transistor being turned-on.

In addition, the fifth transistor and the sixth transistor may be turned-off based on the light-emitting signal being changed to a low voltage during the seventh time period directly after the sixth time period, and the light-emitting device may be configured to stop emission based on the fifth transistor and the sixth transistor being turned-off.

Further, the second transistor and the seventh transistor may be turned-on based on the first scan signal being changed to a high voltage based on the display panel being changed from the first mode to the second mode during the eighth time period directly after the seventh time period, the data signal may be the second data value obtained based on the first data value, and may be applied to the drain terminal and the source terminal of the first transistor based on the second transistor being turned-on, and the second initialization signal may be the pre-set third initialization value, and may be applied to the cathode of the light-emitting device based on the seventh transistor being turned-on.

In addition, the second transistor and the seventh transistor may be turned-off based on the first scan signal being changed to a low voltage during the ninth time period directly after the eighth time period.

Further, the fifth transistor and the sixth transistor may be turned-on based on the light-emitting signal being changed to a high voltage during the tenth time period directly after the ninth time period, and the light-emitting device may be configured to emit light based on the fifth transistor and the sixth transistor being turned-on.

In addition, the fifth transistor and the sixth transistor may be turned-off based on the light-emitting signal being changed to a low voltage during the eleventh time period directly after the tenth time period, and the light-emitting device may be configured to stop emission based on the fifth transistor and the sixth transistor being turned-off.

Further, the display panel may be changed from the first mode to the second mode based on the used state of the display panel.

In addition, the first transistor, the second transistor, the fourth transistor, the fifth transistor, the sixth transistor, and the seventh transistor may respectively be the N-type metal-oxide-semiconductor (NMOS) low temperature polycrystalline silicon (LTPS) thin film transistor (TFT), and the third transistor may be the NMOS Oxide TFT.

Further, the first scan signal and the second scan signal may be signals for controlling the first sub pixel from among the plurality of sub pixels, and the third scan signal may be a signal for controlling the second sub pixel disposed at the upper end of the first sub pixel from among the plurality of sub pixels.

According to an example embodiment, the display panel may include: a plurality of pixels including the plurality of sub pixels, respectively, and the respective sub pixels may include the light-emitting device comprising a light emitting diode and the driving circuit, and the driving circuit may include: a first transistor, a second transistor configured such that any one from among the drain terminal and the source terminal of the second transistor is connected to the source terminal of the first transistor, a third transistor configured such that any one from among the drain terminal and the source terminal of the third transistor is connected to the gate terminal of the first transistor and the other of the drain terminal and the source terminal of the third transistor is connected to the drain terminal of the first transistor, a fourth transistor configured such that any one from among the drain terminal and the source terminal of the fourth transistor is connected to the drain terminal of the first transistor, a fifth transistor configured such that any one from among the drain terminal and the source terminal of the fifth transistor is connected to the source terminal of the first transistor, a sixth transistor configured such that any one from among the drain terminal and the source terminal of the sixth transistor is connected to the anode of the light-emitting device and the other of the drain terminal and the source terminal of the sixth transistor is connected to the drain terminal of the first transistor, a seventh transistor configured such that any one from among the drain terminal and the source terminal is connected to the anode of the light-emitting device, and a capacitor configured such that one end of the capacitor is connected to the gate terminal of the first transistor.

In addition, the gate terminal of the second transistor and the gate terminal of the seventh transistor may be configured to receive the first scan signal, the gate terminal of the third transistor may be configured to receive the second scan signal, the gate terminal of the fourth transistor may be configured to receive the third scan signal, the other from among the drain terminal and the source terminal of the second transistor may be configured to receive the data signal, the other from among the drain terminal and the source terminal of the fourth transistor may be configured to receive the first initialization signal, the other from among the drain terminal and the source terminal of the seventh transistor may be configured to receive the second initialization signal, the gate terminal of the fifth transistor and the gate terminal of the sixth transistor may be configured to receive the light-emitting signal, the other from among the drain terminal and the source terminal of the fifth transistor and the other end of the capacitor may be connected to the first power source, and the cathode of the light-emitting device may be connected to the second power source.

Further, during the first time period, the first scan signal and the light-emitting signal may respectively be high voltages, the second scan signal and the third scan signal may respectively be low voltages, the fourth transistor may be turned-on based on the third scan signal being changed to a high voltage during the second time period directly after the first time period, and the first initialization signal may be the pre-set first initialization value, and may be applied to the drain terminal of the first transistor based on the fourth transistor 4 being turned-on.

In addition, the third transistor may be turned-on based on the second scan signal being changed to a high voltage during the third time period directly after the second time period, and the first initialization signal may be applied to the gate terminal of the first transistor based on the third transistor being turned-on.

According to an example embodiment, a method of operating the display panel may include: applying the first initialization signal to the gate terminal, the drain terminal and the source terminal of the driving transistor, applying the data signal to the gate terminal, the drain terminal and the source terminal of the driving transistor and applying the second initialization signal to the one end of the driving transistor and the light-emitting device, maintaining the data signal applied to the gate terminal of the driving transistor through the capacitor, and emitting the light-emitting device by turning-on the first light-emitting transistor disposed between the drain terminal of the driving transistor and the light-emitting device and the second light-emitting transistor connected to the source terminal of the driving transistor.

According to an example embodiment of the disclosure, the various embodiments described above may be realized with a software including instructions stored in a machine-readable storage media (e.g., computer). The machine may call an instruction stored in the storage medium, and as a device capable of operating according to the called instruction, may include an electronic device (e.g., electronic device (A)) according to the above-mentioned embodiments. Based on the instruction being executed by the processor, the processor may directly or using other elements under the control of the processor perform a function corresponding to the instruction. The instruction may include a code made by a compiler or a code executable by an interpreter. The machine-readable storage medium may be provided in the form of a non-transitory storage medium. Herein, 'non-transitory' merely refers to the storage medium being tangible and not including a signal, and the term does not differentiate data being semi-permanently stored or being temporarily stored in the storage medium.

According to an embodiment, a method according to the various embodiments described above may be provided included a computer program product. The computer program product may be exchanged between a seller and a purchaser as a commodity. The computer program product may be distributed in the form of a machine-readable storage medium (e.g., a compact disc read only memory (CD-ROM)), or distributed online through an application store (e.g., PLAYSTORE™). In the case of online distribution, at least a portion of the computer program product may be at least stored temporarily in a storage medium such as a server of a manufacturer, a server of an application store, or a memory of a relay server, or temporarily generated.

In addition, according to an embodiment of the disclosure, the various embodiments described above may be realized in a recordable medium which is readable by a computer or a device similar to the computer using software, hardware, or the combination of software and hardware. In some cases, embodiments described herein may be implemented by the processor itself. According to a software implementation, embodiments such as the procedures and functions described herein may be realized with separate software modules. The respective software modules may perform one or more functions and operations described herein.

The computer instructions for performing processing operations of a device according to the various embodiments described above may be stored in a non-transitory computer-readable medium. The computer instructions stored in this non-transitory computer-readable medium may cause a specific device to perform the processing operations in the device according to the above-described various embodiments when executed by the processor of the specific device. The non-transitory computer readable medium may refer to a medium that stores data semi-permanently rather than storing data for a very short time, such as a register, a cache, a memory, or the like, and is readable by a device. Examples of the non-transitory computer readable medium may include, for example, and without limitation, a compact disc (CD), a digital versatile disc (DVD), a hard disc, a Blu-ray disc, a universal serial bus (USB), a memory card, a read only memory (ROM), and the like.

In addition, respective elements (e.g., a module or a program) according to the various embodiments described above may be comprised of a single entity or a plurality of entities, and some sub-elements from among the above-mentioned sub-elements may be omitted or other sub-elements may be further included in the various embodiments. Alternatively or additionally, some elements (e.g., modules or programs) may be integrated into one entity to perform the same or similar functions performed by the respective corresponding elements prior to integration. Operations performed by a module, a program, or other element, in accordance with various embodiments, may be performed sequentially, in parallel, repetitively, or in a heuristically manner, or at least some operations may be performed in a different order, omitted, or a different operation may be added.

While the disclosure has been illustrated and described with reference to various example embodiments thereof, it will be understood that the various example embodiments are intended to be illustrative, not limiting. It will be understood by those skilled in the art that various changes in form and detail may be made therein without departing from the true spirit and full scope of the disclosure, including the appended claims and their equivalents. It will also be understood that any of the embodiment(s) described herein may be used in conjunction with any other embodiment(s) described herein.

What is claimed is:

1. A display panel including a plurality of pixels each including a plurality of sub pixels, the respective sub pixels comprising:
   a light-emitting device comprising a light-emitting diode; and
   a driving circuit,
   wherein the driving circuit comprises:
      a first transistor;
      a second transistor configured such that any one from among a drain terminal and a source terminal of the second transistor is connected to a source terminal of the first transistor;
      a third transistor configured such that any one from among a drain terminal and a source terminal of the third transistor is connected to a gate terminal of the first transistor and other of the drain terminal and the source terminal of the third transistor is connected to a drain terminal of the first transistor;
      a fourth transistor configured such that any one from among a drain terminal and a source terminal of the fourth transistor is connected to the drain terminal of the first transistor;
      a fifth transistor configured such that any one from among a drain terminal and a source terminal of the fifth transistor is connected to a cathode of the light-emitting device and the other of the drain terminal and the source terminal of the fifth transistor is connected to the drain terminal of the first transistor;

a sixth transistor configured such that any one from among a drain terminal and a source terminal of the sixth transistor is connected to the source terminal of the first transistor;

a seventh transistor configured such that a gate terminal of the seventh transistor is connected to a gate terminal of the second transistor and any one from among a drain terminal and a source terminal of the seventh transistor is connected to the cathode of the light-emitting device; and a capacitor configured such that one end of the capacitor is connected to the gate terminal of the first transistor.

2. The display panel of claim 1, wherein, the gate terminal of the second transistor and the gate terminal of the seventh transistor are configured to receive a first scan signal, a gate terminal of the third transistor is configured to receive a second scan signal, a gate terminal of the fourth transistor is configured to receive a third scan signal, the other from among the drain terminal and the source terminal of the second transistor is configured to receive a data signal, the other from among the drain terminal and the source terminal of the fourth transistor is configured to receive a first initialization signal, the other from among the drain terminal and the source terminal of the seventh transistor is configured to receive a second initialization signal, a gate terminal of the fifth transistor and a gate terminal of the sixth transistor are configured to receive a light-emitting signal, an anode of the light-emitting device is connected to a first power source, and the other from among the drain terminal and the source terminal of the sixth transistor and an other end of the capacitor are connected to a second power source.

3. The display panel of claim 2, wherein, the first scan signal, the second scan signal, the third scan signal, and the light-emitting signal are respectively low voltages during a first time period, the fourth transistor is configured to be turned-on based on the third scan signal being changed to a high voltage during a second time period directly after the first time period, and the first initialization signal is a pre-set first initialization value, and is applied to a drain terminal of the first transistor based on the fourth transistor being turned-on.

4. The display panel of claim 3, wherein, the third transistor is configured to be turned-on based on the second scan signal being changed to a high voltage during a third time period directly after the second time period, and the first initialization signal is applied to the gate terminal of the first transistor based on the third transistor being turned-on.

5. The display panel of claim 4, wherein, the second transistor and the seventh transistor are configured to be turned-on based on the first scan signal being changed to a high voltage during a fourth time period directly after the third time period, the fourth transistor is configured to be turned-off based on the third scan signal being changed to a low voltage during the fourth time period, the data signal is a first data value, and is applied to the gate terminal, the drain terminal and the source terminal of the first transistor based on the second transistor being turned-on, and the second initialization signal is a pre-set second initialization value, and is applied to the cathode of the light-emitting device based on the seventh transistor being turned-on.

6. The display panel of claim 5, wherein, the second transistor and the seventh transistor are configured to be turned-off based on the first scan signal being changed to a low voltage during a fifth time period directly after the fourth time period, the third transistor is configured to be turned-off based on the second scan signal being changed to a low voltage during the fifth time period, and the data signal is maintained in the gate terminal, the drain terminal and the source terminal of the first transistor through the capacitor.

7. The display panel of claim 6, wherein, the fifth transistor and the sixth transistor are configured to be turned-on based on the light-emitting signal being changed to a high voltage during a sixth time period directly after the fifth time period, and the light-emitting device is configured to emit light based on the fifth transistor and the sixth transistor being turned-on.

8. The display panel of claim 7, wherein, the fifth transistor and the sixth transistor are configured to be turned-off based on the light-emitting signal being changed to a low voltage during a seventh time period directly after the sixth time period, and the light-emitting device is configured to stop emission based on the fifth transistor and the sixth transistor being turned-off.

9. The display panel of claim 8, wherein, the second transistor and the seventh transistor are configured to be turned-on based on the first scan signal being changed to a high voltage based on the display panel being changed from a first mode to a second mode during an eighth time period directly after the seventh time period, the data signal is a second data value obtained based on the first data value, and is applied to the drain terminal and the source terminal of the first transistor based on the second transistor being turned-on, and the second initialization signal is a pre-set third initialization value, and is applied to the cathode of the light-emitting device based pm the seventh transistor being turned-on.

10. The display panel of claim 9, wherein, the second transistor and the seventh transistor are configured to be turned-off based on the first scan signal being changed to a low voltage during a ninth time period directly after the eighth time period.

11. The display panel of claim 10, wherein, the fifth transistor and the sixth transistor are configured to be turned-on based on the light-emitting signal being changed to a high voltage during a tenth time period directly after the ninth time period, and the light-emitting device is configured to emit light based on the fifth transistor and the sixth transistor being turned-on.

12. The display panel of claim 11, wherein, the fifth transistor and the sixth transistor are configured to be turned-off based on the light-emitting signal being changed to a low voltage during an eleventh time period directly after the tenth time period, and the light-emitting device is configured to stop emission based on the fifth transistor and the sixth transistor being turned-off.

13. The display panel of claim 9, wherein the display panel is changed from the first mode to the second mode based on a used state of the display panel.

14. The display panel of claim 1, wherein the first transistor, the second transistor, the fourth transistor, the fifth transistor, the sixth transistor, and the seventh transistor respectively comprise an N-type metal-oxide-semiconductor (NMOS) low temperature polycrystalline silicon (LTPS) thin film transistor (TFT), and the third transistor comprises an NMOS Oxide TFT.

15. A display panel including a plurality of pixels each including a plurality of sub pixels, the respective sub pixels comprising:

a light-emitting device comprising a light-emitting diode; and a driving circuit, wherein the driving circuit comprises:

a first transistor;

a second transistor configured such that any one from among a drain terminal and a source terminal of the second transistor is connected to a source terminal of the first transistor;

a third transistor configured such that any one from among a drain terminal and a source terminal of the third transistor is connected to a gate terminal of the first transistor and the other of the drain terminal and the source terminal of the third transistor is connected to a drain terminal of the first transistor;

a fourth transistor configured such that any one from among a drain terminal and a source terminal of the fourth transistor is connected to the drain terminal of the first transistor;

a fifth transistor configured such that any one from among a drain terminal and a source terminal of the fifth transistor is connected to a source terminal of the first transistor;

a sixth transistor configured such that any one from among a drain terminal and a source terminal of the sixth transistor is connected to an anode of the light-emitting device and the other of the drain terminal and the source terminal of the sixth transistor is connected to the drain terminal of the first transistor;

a seventh transistor configured such that a gate terminal of the seventh transistor is connected to a gate terminal of the second transistor and any one from among a drain terminal and a source terminal of the seventh transistor is connected to the anode of the light-emitting device; and a capacitor configured such that one end of the capacitor is connected to the gate terminal of the first transistor.

* * * * *